(12) United States Patent
Beausoleil et al.

(10) Patent No.: US 7,778,501 B2
(45) Date of Patent: Aug. 17, 2010

(54) INTEGRATED CIRCUITS HAVING PHOTONIC INTERCONNECT LAYERS AND METHODS FOR FABRICATING SAME

(75) Inventors: Raymond G. Beausoleil, Redmond, WA (US); Scott Corzine, Sunnyvale, CA (US); Sean Spillane, Mountain View, CA (US); Wei Wu, Mountain View, CA (US); R. Stanley Williams, Portola Valley, CA (US)

(73) Assignee: Hewlett-Packard Development Company, L.P., Houston, TX (US)

( * ) Notice: Subject to any disclaimer, the term of this patent is extended or adjusted under 35 U.S.C. 154(b) by 0 days.

(21) Appl. No.: 11/732,549

(22) Filed: Apr. 3, 2007

(65) Prior Publication Data

US 2008/0246106 A1    Oct. 9, 2008

(51) Int. Cl.
    *G02B 6/12* (2006.01)
(52) U.S. Cl. .......................................... 385/14
(58) Field of Classification Search .................... 385/14
    See application file for complete search history.

(56) References Cited

U.S. PATENT DOCUMENTS 6,330,377 B1 * 12/2001 Kosemura ..................... 385/14
6,383,916 B1 * 5/2002 Lin ............................. 438/637
6,611,635 B1 * 8/2003 Yoshimura et al. ............. 385/14
6,723,577 B1 * 4/2004 Geusic et al. ................. 438/31
7,043,106 B2 * 5/2006 West et al. ..................... 385/14
7,327,022 B2 * 2/2008 Claydon et al. ............. 257/689
2006/0228068 A1 * 10/2006 Ouchi ......................... 385/14
2008/0181558 A1 * 7/2008 Hartwell et al. ................ 385/14

* cited by examiner

*Primary Examiner*—Charlie Peng

(57) ABSTRACT

Various embodiments of the present invention are directed to integrated circuits having photonic interconnect layers and methods for fabricating the integrated circuits. In one embodiment of the present invention, an integrated circuit comprises an electronic device layer and one or more photonic interconnect layers. The electronic device layer includes one or more electronic devices, and the electronic device layer is attached to a surface of an intermediate layer. One of the photonic interconnect layers is attached to an opposing surface of the intermediate layer, and each of the photonic interconnect layers has at least one photonic device in communication with at least one of the electronic devices of the electronic device layer.

9 Claims, 19 Drawing Sheets

INTEGRATED CIRCUITS HAVING PHOTONIC INTERCONNECT LAYERS AND METHODS FOR FABRICATING SAME

TECHNICAL FIELD

Embodiments of the present invention are related to integrated circuits, and, in particular, to integrated circuits having a number of photonic interconnect layers for transmitting signals to electronic devices.

BACKGROUND

In the mid 1960's, it was observed by semiconductor manufacturers that the number of transistors fabricated on integrated circuits ("chips") was doubling about every 18 months. This trend has continued and is now termed "Moore's Law." The number of transistors is viewed as a rough measure of computer processing power, which, in turn, corresponds to data processing speed. Another version of Moore's Law relates to memory capacity or the density of memory cells in memory chips. Although Moore's Law was originally made as an observation, over time Moore's Law has became widely accepted by the semiconductor industry as a goal for increasing computer processing power and memory capacity. As a result, semiconductor manufacturers have developed technologies for reducing the size of chip components to microscale and even nanoscale dimensions. These chips are typically embedded in packages, and the packages may be connected to other chips or electronic devices by way of signal wires patterned on a circuit board.

FIGS. 1A-1C illustrate an example chip and package with circuit board interconnects for transmitting data to other chips and devices. FIG. 1A illustrates a top view of an example chip 102 and package 104. The package 104 is connected to four separate sets of nine parallel signal lines or wires 106-109, each set of signal lines is called a "wire bus." Each wire bus 106-109 transmits data in parallel between the chip 102 and other chips or electronic devices (not shown) that may be located on the same circuit board or different circuit boards. For example, the wire bus 106 may be connected directly to a random access memory ("RAM") chip, which is located on the same circuit board (not shown), and the wire bus 108 may be connected to a sensor, which is located on a different circuit board (not shown).

FIG. 1B illustrates an enlargement of the chip 102 and the package 104 shown in FIG. 1A. The chip 102 includes a number of contact pads located near the perimeter of the chip 102, such as contact pad 110, and the package 104 includes a number of pins which are located around the perimeter of the package 104, such as pin 112. Each contact pad is connected to a single pin via a wire, and each pin is connected directly to a wire in a wire bus. For example, the contact pad 110 is connected to the pin 112 via a wire 114, and the pin 112 is connected to a bus wire 116. Each electrical signal transmitted or received by the chip 102 is carried by a contact pad, a wire, a pin, and a wire in a wire bus. Solder bonding.

FIG. 1C illustrates a cross-sectional view of the chip 102 and the package 104 shown in FIG. 1B. As shown in FIG. 1C, the chip 102 and the package 104 are supported by a circuit board 118. The chip 102 comprises a Si-based electronic device layer 120, and an electronic interconnect layer composed of a local interconnect layer 122 and a global interconnect layer 124. The electronic device layer 120 comprises transistors and/or capacitor components, electrical current sources, and drains (not shown). Interconnects in the local interconnect layer 122, such as interconnect 126, electronically interconnect devices in the electronic device layer 120, and interconnects in the global interconnect layer 124 electronically interconnect components of the electronic device layer 120 to the contact pads. For example, interconnect 128 electronically interconnects components in the electronic device layer 120 to the contact pad 110. The local interconnect layer 122 serves as a multiplexer by distributing signals between components of the electronic device layer 120, and the global interconnect layer 124 serves a multiplexer by distributing signals generated within the electronic device layer 120 to other chips or devices. For example, interconnect 128 transmits signals to the contact pad 110, which is coupled to the wire 116 by way of the pin 112 and the wire 114.

In order for a first chip to transmit data to a second chip, the first chip multiplexes one or more signals encoding the data. The signals are multiplexed by the global interconnect around the perimeter of the first chip and transmitted to the second chip over a wire bus. Each wire in a wire bus carries one of the multiplexed signals. The global interconnect of the second chip demultiplexes the signals in order to obtain one or more signals that the second chip uses to process the data. FIG. 1D illustrates a wire bus that electronically interconnects an example microprocessing ("CPU") chip 130 and an example RAM chip 132. A wire bus connecting the CPU chip 130 to the RAM chip 132 comprises 5 bus wires 134-138. Suppose the CPU chip 130 generates data to be stored temporarily in the RAM chip 132. The CPU chip 130 multiplexes the signal corresponding to the data by distributing the signal over contact pads 140. The distributed signal can then be transmitted over the bus wires 134-138 to the contact pads 142 of the RAM chip 132. The RAM chip demultiplexes the distributed signals received by contact pads 142 into fewer signals that can be used to store the data in one or more memory cells of the RAM chip 132.

Although recent semiconductor fabrication methods have made it possible to increase the density of transistors and memory cells in chips, the number of wires needed to interconnect these chips has increased, which has increased the need for larger circuit board surface areas and longer bus wires. As a result, the time needed to transmit data between chips, measured in chip clock cycles, has increased. Although semiconductor manufacturers have responded by developing techniques for reducing the cross-sectional dimensions of the wires so that more wires can be fit into smaller surface areas, there exist limitations on these cross-sectional dimensions. For example, as wire sizes decrease and more wires are packed into a smaller surface area, the number of interference effects increase, such as interference between signals transmitted on adjacent wires, and the number of thermal effects increase, because wire resistance increases as the wire cross-sectional dimensions decrease. These physical limitations make it unlikely that semiconductor manufacturers can continue to take advantage of the component miniaturization offered by microscale and nanoscale semiconductor fabrication techniques. Furthermore, the intrinsic capacitance of the multiplexing and demultiplexing carried out at chip boundaries can greatly exceed the capacitance of the chip, which reduces signal speed transmission between chips. Manufacturers, designers, and users of computing devices have recognized a need for interconnects that provide high bandwidth and high-speed global interconnects between chips and other electronic devices.

SUMMARY

Various embodiments of the present invention are directed to integrated circuits having photonic interconnect layers and methods for fabricating the integrated circuits. In one embodiment of the present invention, an integrated circuit comprises an electronic device layer and one or more photonic interconnect layers. The electronic device layer includes one or more electronic devices, and the electronic device layer is attached to a surface of an intermediate layer. One of the photonic interconnect layers is attached to an opposing surface of the intermediate layer, and each of the photonic interconnect layers has at least one photonic device in communication with at least one of the electronic devices of the electronic device layer.

DETAILED DESCRIPTION

Figure 1A:
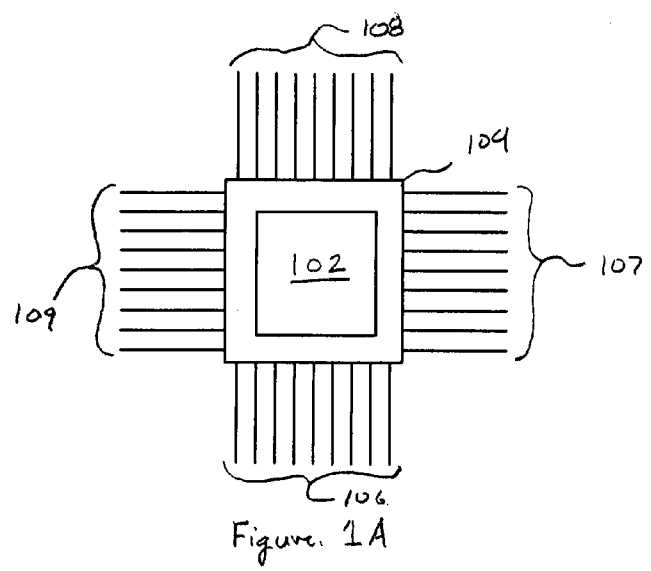
FIGS. 1A-1C illustrate an example chip and package with circuit board interconnects for transmitting data to other chips and devices.
Figure 1B:
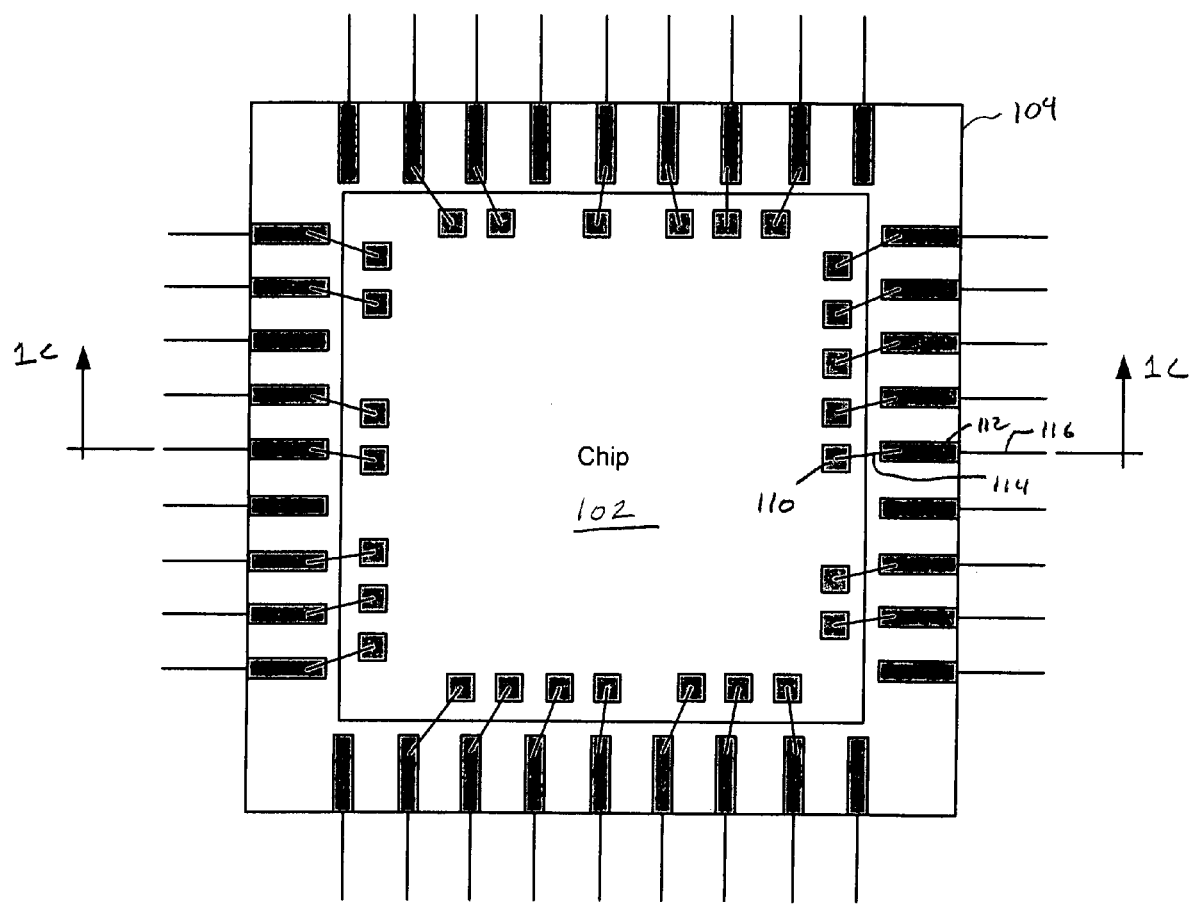
Figure 1C:
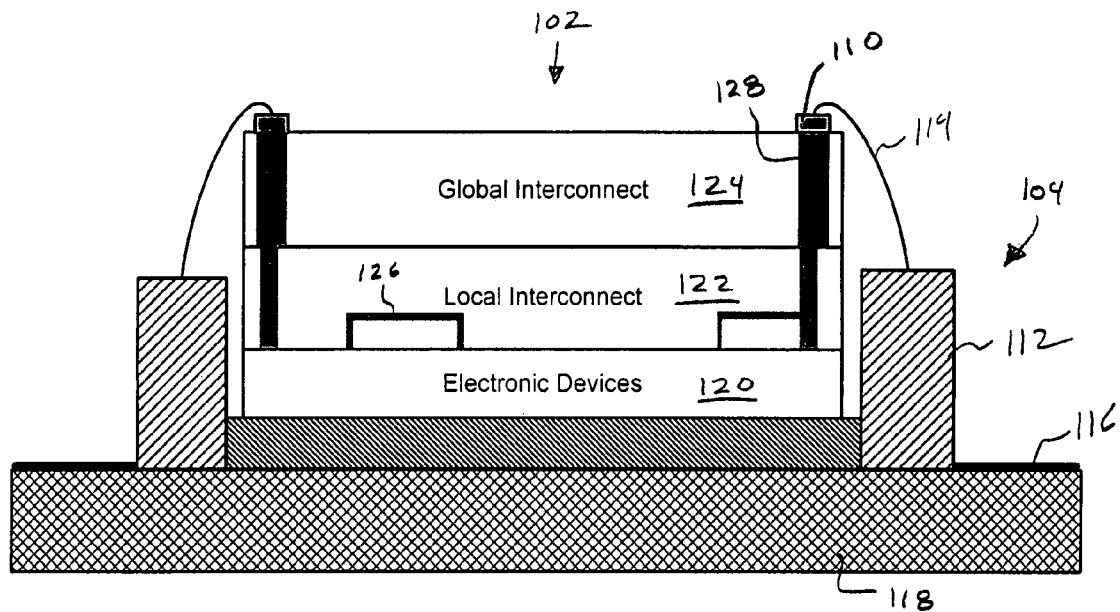
Figure 1D:
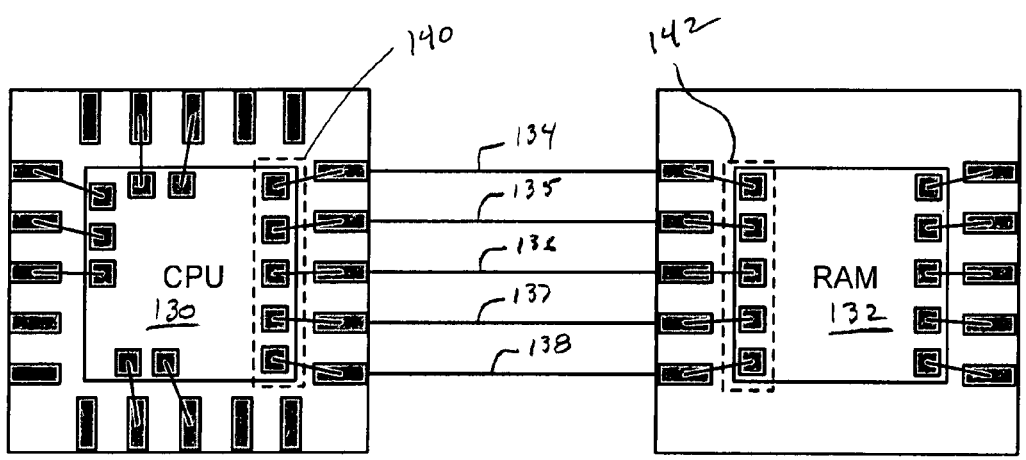
FIG. 1D illustrates a wire bus that electronically interconnects an example microprocessing chip and an example random access memory chip.

Various embodiments of the present invention are directed to integrated circuits having photonic interconnect layers and methods for fabricating the integrated circuits. The term "electronic devices" as used in the following description refers to general-purpose electronic devices, such as a CPU, RAM, read only memory, a sensor, or a logic cell and can also be used to refer to larger integrated electronic devices, such as a field programmable gate array ("FPGA"), which features a matrix of interconnected logic cells, or an application specific integrated circuit ("ASIC"), which features a number of different interconnected general purpose electronic devices. The term "photonic" refers to devices that can be used to transmit either classical electromagnetic signals or quantized electromagnetic signals with wavelengths that span the electromagnetic spectrum. In other words, the term "photonic" as used to describe embodiments of the present invention is not limited to devices for transmitting single quanta, also called "photons," of electromagnetic signals. The term "channel," also called "optical channel," refers to electromagnetic radiation transmitted at one wavelength through a waveguide. In the various embodiments described below, a number of structurally similar components have been provided with the same reference numerals and, in the interest of brevity, an explanation of their structure and function is not repeated.

Photonic interconnect layer embodiments of the present invention can be used to replace certain global, wire-based interconnects used to interconnect physically separated integrated circuits, because transmitting information encoded in channels via waveguides has a number of advantages over transmitting encoded electrical signals via signal lines. First, degradation or loss is much less for channels transmitted via waveguides than for electrical signals transmitted via signal lines. Second, waveguides can be fabricated to support a much higher bandwidth than signal lines. For example, a single Cu or Al wire can only transmit a single electrical signal, while a single optical fiber can be configured to transmit about 100 or more channels. Finally, electromagnetic radiation provides, in general, a much higher transmission rate. For example, electrical signals can be transmitted through Cu and Al wires at about c/3, where c represents the speed of light in free space (about 300,000 k/s). By contrast, channels propagate through photonic devices, such as optical fibers and photonic crystal waveguides, at about c/1.5, which is about twice the speed allowed by wire-based interconnects.

Figure 2:
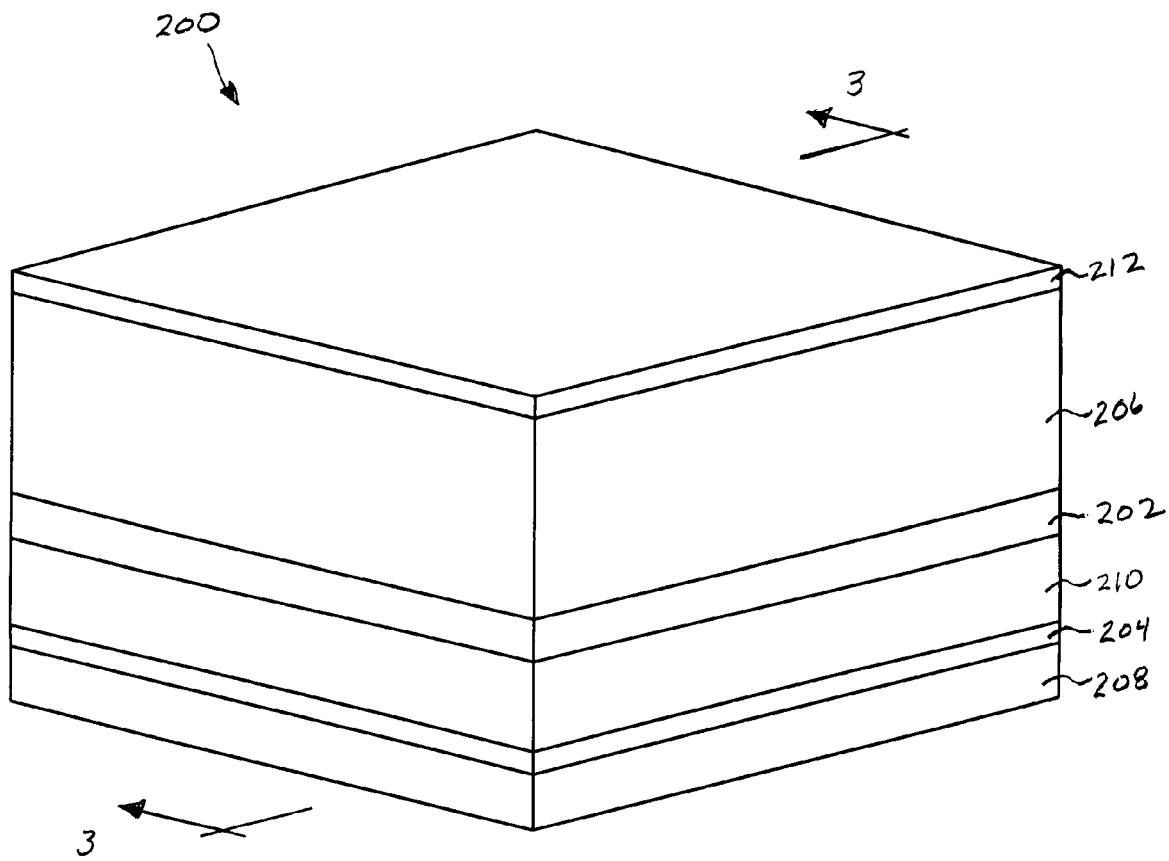
FIG. 2 illustrates an isometric view of an integrated circuit that represents an embodiment of the present invention.

FIG. 2 illustrates an isometric view of an integrated circuit 200 that represents an embodiment of the present invention. The integrated circuit 200 includes an electronic device layer 202 located between a photonic interconnect layer 204 and an electronic interconnect layer 206. The photonic interconnect layer 202 is supported by a substrate 208 and separated from the electronic device layer 202 by an intermediate layer 210. The integrated circuit 200 also includes a passivation layer 212 that caps the electronic interconnect layer 206. The electronic devices layer 202 includes a number of electronic devices (not shown) that can be in electrical communication with other integrated circuits and electronic devices via interconnects in the electronic interconnect layer 206. The photonic interconnect layer 204 receives information encoded in channels to be processed by the electronic device layer 202 and transmits information encoded in channels generated by the electronic device layer 202, as described in greater detail below with reference to FIGS. 4-10. The intermediate layer 210 and the substrate 208 are composed of materials having a lower refractive index than the photonic interconnect layer 204 so that the intermediate layer 210 and the substrate 208 can serve as cladding layers for the photonic interconnect layer 204. For example, the intermediate layer 210 can be composed of a single layer of $SiO_2$ or a layer of Si sandwiched between two layers of $SiO_2$, and the substrate 208 can be composed of $SiO_2$.

Figure 3:
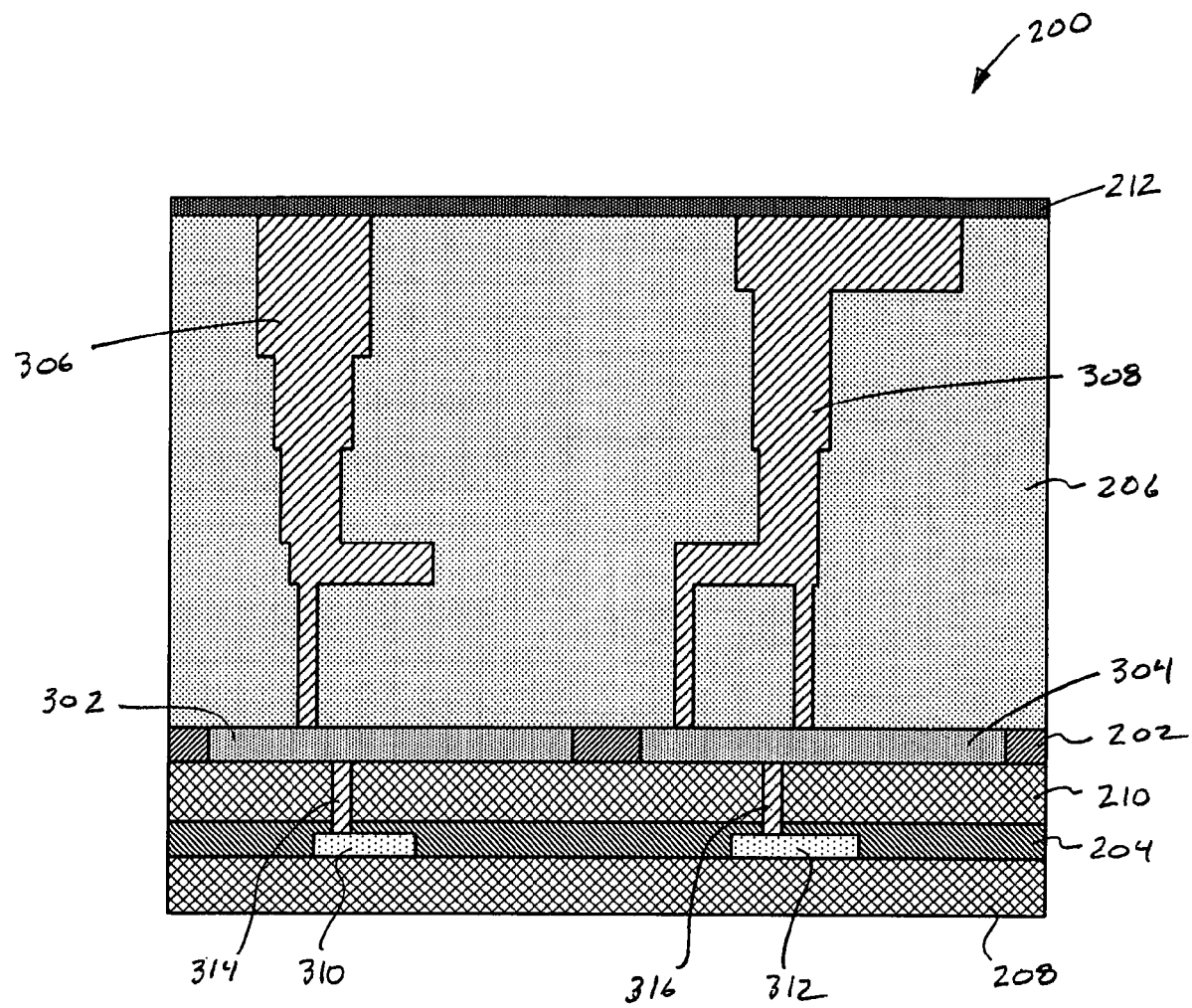
FIG. 3 illustrates a cross-sectional view of the integrated circuit, shown in FIG. 2, that represents an embodiment of the present invention.

FIG. 3 illustrates a cross-sectional view of the integrated circuit 200, shown in FIG. 2, that represents an embodiment of the present invention. As shown in FIG. 3, the electronic device layer 202 includes a first electronic device 302 and a second electronic device 304, and the electronic interconnect layer 206 includes a first interconnect 306 in electrical communication with the first electronic device 302 and a second interconnect 308 in electrical communication with the second electronic device 304. The electronic interconnect layer 206 may also include a number of interconnects (not shown) that provide electrical communication between the electronic device 302 and 304. The photonic interconnect layer 204 includes a first photonic device 310 and a second photonic device 312. The first and second photonic devices 310 and 312 can be waveguides, electro-optic modulators, and photodiodes, and certain embodiments are described in greater detail below with reference to FIGS. 5-10. The first photonic device 310 is in communication with the first electronic device 302 via a third interconnect 314, and the second photonic device 312 is in communication with the second electronic device 304 via a fourth interconnect 316. The interconnects 306 and 308 can be composed of Cu, Al, Pt, or other suitable conductor materials. In certain embodiments of the present invention, the interconnects 314 and 316 can also be composed of Cu, Al, Pt, or other suitable conductor materials. In other embodiments of the present invention, the interconnects 314 and 316 can be waveguides that transmit modes of electromagnetic radiation from the photonic devices 310 and 312 to modulators and photodiodes located within the electronic device layer 202.

Figure 4:
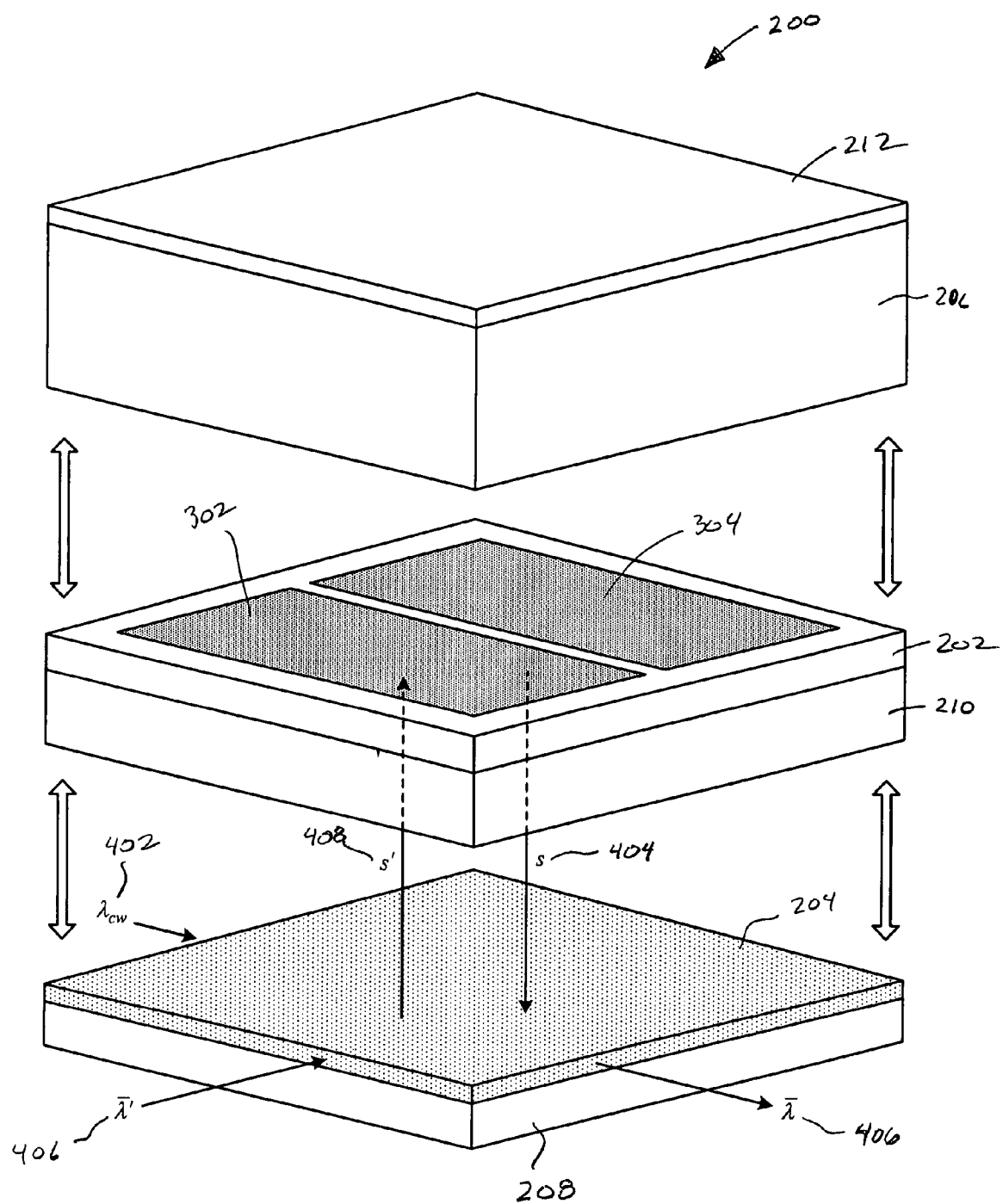
FIG. 4 illustrates an exploded-isometric view of the integrated circuit, shown in FIG. 2, that represents an embodiment of the present invention.
Figure 5A:
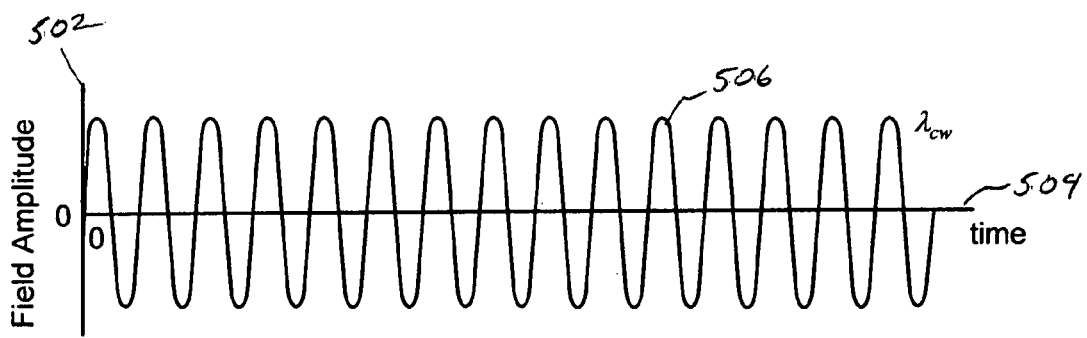
FIG. 5A shows a plot of the electric field component of a carrier wave $\lambda_{cw}$ versus time.

The photonic interconnect layer 204 can be used to transmit information that conventionally would have been transmitted over the global wire bus when the process of encoding information in channels and transmitting the encoded channels over waveguides is faster and provides a higher bandwidth than transmitting the same information in electrical signals over the global wire bus. General operation of the photonic interconnect layer 204 and the electronic device layer 202 is now described with reference to FIGS. 4-5. FIG. 4 illustrates an exploded-isometric view of the integrated circuit 200, shown in FIG. 2, that represents an embodiment of the present invention. As shown in FIG. 4, the photonic interconnect layer 204 receives an unencoded channel, called a "carrier wave," $\lambda_{cw}$ 402. FIG. 5A shows a plot of the electric field component of a carrier wave $\lambda_{cw}$ versus time. In FIG. 5A, a vertical axis 502 corresponds to the electric field amplitude, and a horizontal axis 504 corresponds to time. A curve 506 represents the electric field component E(z,t) of the carrier wave $\lambda_{cw}$ with a regular vibrational frequency. The carrier wave $\lambda_{cw}$ typically carriers no information.

Figure 5B:
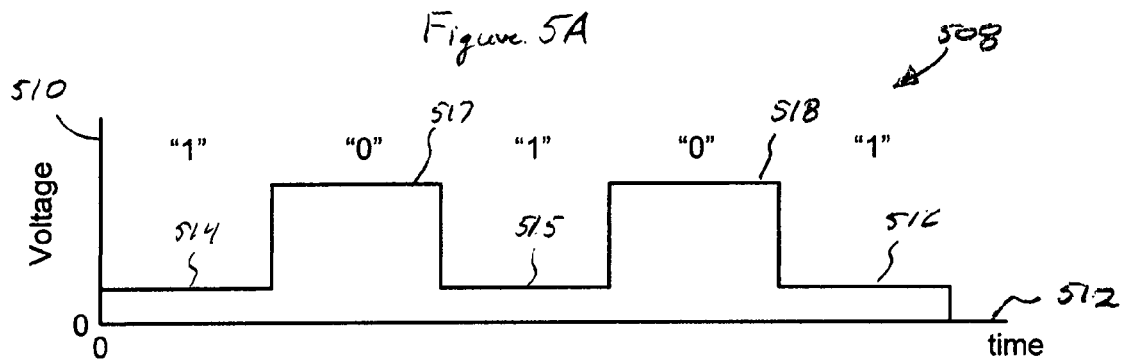
FIG. 5B shows a plot of an example time-varying voltage pattern.

Returning to FIG. 4, an electrical signal s 404 encoding information is generated by the electronic device 302 and transmitted to the photonic interconnect layer. The electrical signal s 404 encodes information in form of a time-varying voltage pattern. FIG. 5B shows a plot of an example time-varying voltage pattern 508 versus time. A vertical axis 510 represents voltage magnitude, and a horizontal axis 512 represents time. The time-varying voltage pattern 508 encodes a five-digit binary number "10101," where low magnitude voltages 514-516 correspond to the binary number "1," and relatively high magnitude voltages 517 and 518 correspond to the binary number "0."

Figure 5C:
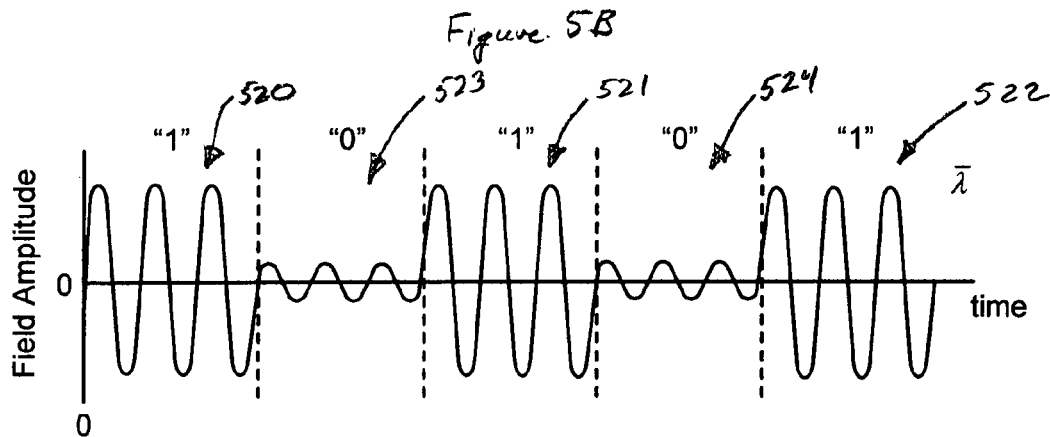
FIG. 5C illustrates an example of an amplitude modulated channel.
Figure 5D:
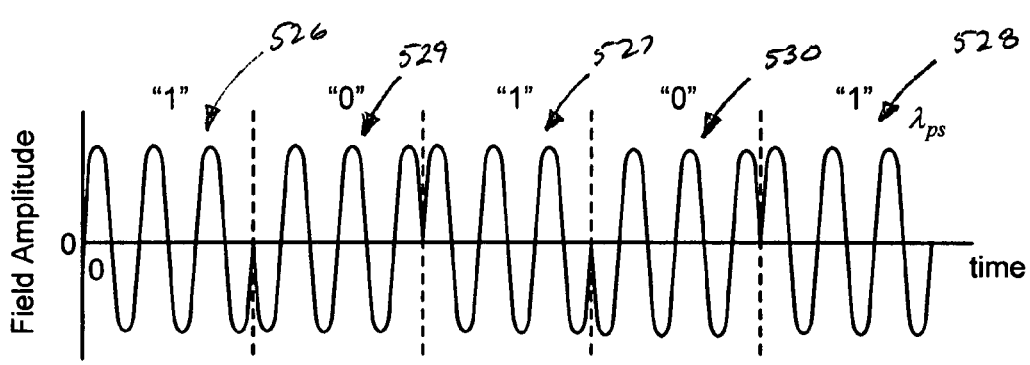
FIG. 5D illustrates an example of a phase modulated channel

Returning again to FIG. 4, the photonic interconnect 204 includes an electro-optic modulator (not shown) that receives the electrical signal s 404 and encodes the information in the carrier wave $\lambda_{cw}$ 402 to produce an encoded channel $\bar{\lambda}$ 406. The encoded channel $\bar{\lambda}$ 406 can be produced by either amplitude or phase modulation of the carrier wave $\lambda_{cw}$ 402. FIG. 5C illustrates an example of an amplitude modulated channel. In FIG. 5C, a single bit corresponds to four consecutive cycles of the signal, which is roughly equal to the time associated with a bit of the voltage pattern 508. The cycles 520-522 have large amplitudes, which correspond to the binary number "1" and low voltage levels 514-516, respectively, shown in FIG. 5B. The cycles 523 and 524 have relatively small amplitudes, which correspond to the binary number "0" and high voltage levels 517 and 518, respectively. FIG. 5D illustrates an example of a phase modulated channel. In FIG. 5D, a single bit also corresponds to four consecutive cycles of the signal. The cycles 526-528 are not phase shifted and correspond to the binary number "1" and low voltage levels 514-516, respectively, shown in FIG. 5B. The cycles 529 and 530 are phase shifted by ½ the wavelength of the carrier wave $\lambda_{cw}$, which corresponds to the binary number "0" and high voltage levels 517 and 518, respectively.

Returning again to FIG. 4, information encoded in a channel $\bar{\lambda}$ 406 is transmitted into the photonic interconnect layer 204 and converted into an electronic signal s' 408 encoding the same information, which is transmitted to the electronic device 302 for processing.

Figure 6:
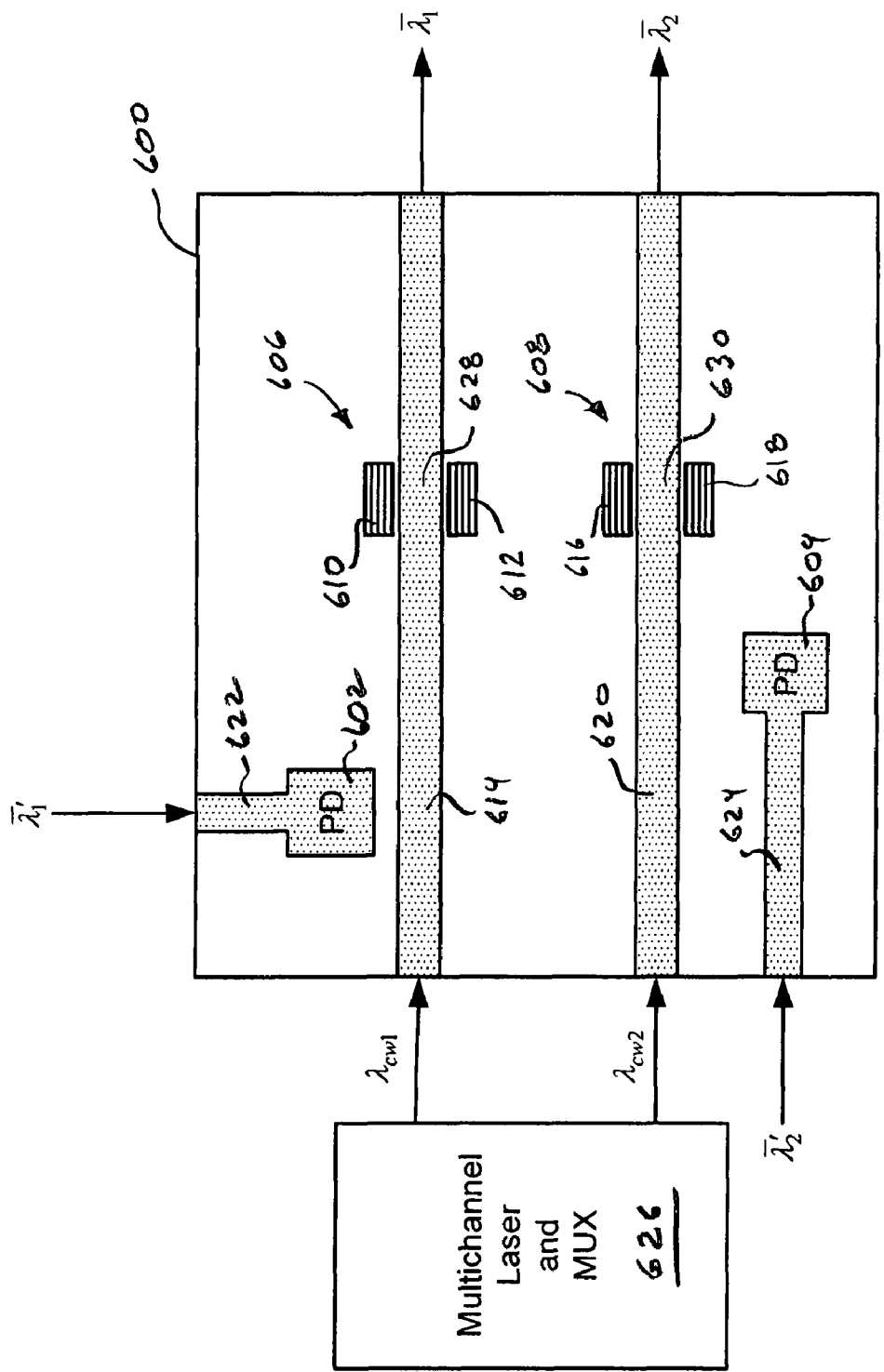
FIG. 6 illustrates a first example configuration of photonic devices of a photonic interconnect layer that represents an embodiment of the present invention

In alternate embodiments of the present invention, a photonic interconnect layer may include a number of different photonic devices that can be configured in different ways in order to provide electrical and/or photonic communication with electronic devices in an electronic device layer. FIG. 6 illustrates a first example configuration of photonic devices of a photonic interconnect layer 600 that represents an embodiment of the present invention. The photonic interconnect layer 600 includes a first photodiode 602, a second photodiode 604, a first electro-optic modulator 606, and a second electro-optic modulator 608. The electro-optic modulator 606 is composed of electrodes 610 and 612 located on opposite sides of a waveguide 614, and the electro-optic modulator 608 is composed of electrodes 616 and 618 located on opposite sides of a waveguide 620. The photonic devices are in electrical communication with the electronic devices of the electronic device layer 202, shown in FIG. 4. For example, the first photodiode 602 and the first electro-optic modulator 606 can be in electrical communication with the electronic device 302, shown in FIG. 4, and the second photodiode 604 and the second electro-optic modulator 608 can be in electrical communication with the electronic device 304, shown in FIG. 4.

In order to transmit information generated by the electronic devices 302 and 304 to other electronic devices, a multi-channel laser and multiplexer 626 generates a first carrier wave $\lambda_{cw1}$ and a second carrier wave $\lambda_{cw2}$, which are transmitted separately in the waveguides 614 and 620, respectively. The electronic devices 302 and 304 generate information in the form of a time-varying voltage patterns, as described above with reference to FIG. 5A. The time-varying voltage pattern generated by the electronic device 302 is applied to the electrodes 610 and 612 of the electro-optic modulator 606, and the time-varying voltage pattern generated by the electronic device 304 is applied to the electrodes 616 and 618 of the electro-optic modulator 608. The time-varying voltage patterns create corresponding time-varying refractive index changes across waveguide regions 628 and 630, which modulate the carrier waves $\lambda_{cw1}$ and $\lambda_{cw2}$ to produce corresponding channels $\overline{\lambda}_1$ and $\overline{\lambda}_2$ encoding the same information encoded in the time-varying voltage patterns. Information generated by other electronic devices can be transmitted to the electronic devices 302 and 304 for processing in the form of a first information encoded channel $\overline{\lambda}_1'$ and a second information encoded channel $\overline{\lambda}_2'$. The photonic interconnect layer 204 includes a waveguide 622 that receives and transmits the first information encoded channel $\overline{\lambda}_1'$ to the first photodiode 602, and includes a waveguide 624 that receives and transmits the second information encoded channel $\overline{\lambda}_2'$ to the second photodiode 604. The photodiodes 610 and 612 convert the channels $\overline{\lambda}_1'$ and $\overline{\lambda}_2'$ into electrical signals encoding the same information and transmit the electrical signals to the electronic devices 302 and 304, respectively, for processing.

Figure 7:
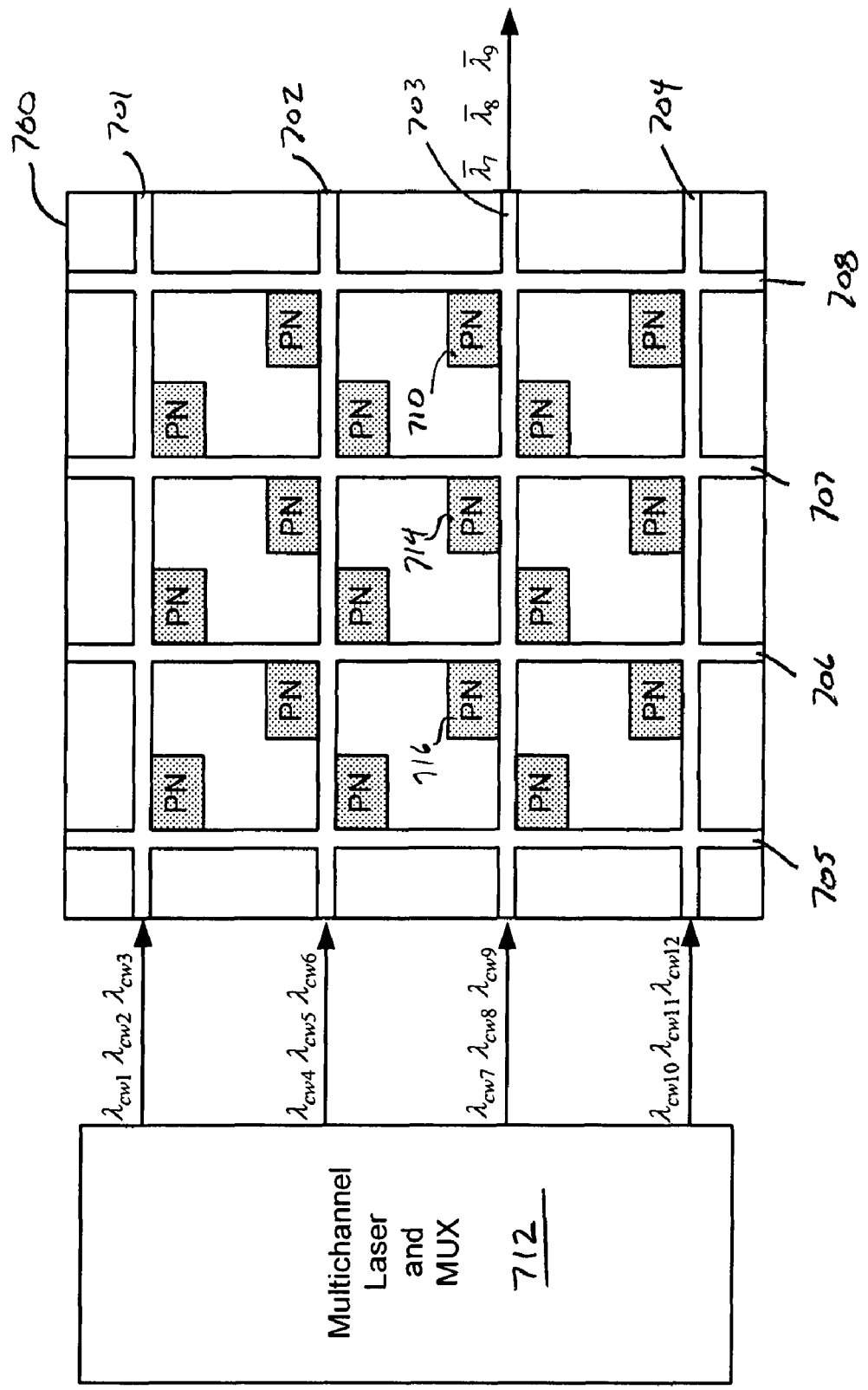
FIG. 7 illustrates a second example configuration of photonic devices of a photonic interconnect layer that represents an embodiment of the present invention.

FIG. 7 illustrates a second example configuration of photonic devices of a photonic interconnect layer 700 that represents an embodiment of the present invention. The photonic interconnect layer 700 represents a two-dimensional photonic crystal that includes 18 photonic nodes, denoted "PN," and photonic crystal waveguides 701-708. For a description of photonic crystals and photonic crystal waveguides see *Fundamentals of Optical Waveguides*, by Katsunari Okamoto, Elsevier Inc. 2005, *Optical Waveguide Theory*, by Snyder and Love, Chapman and Hall, London, 1983, and *Photonic Crystals*, by Jean_Michel Lourtioz, Springer-Verlag, Berlin, 2005. Each photonic node is in electrical and/or photonic communication with an electronic device in the electronic device layer 202 and can be optically coupled to one or two of the waveguides. For example, the photonic node 710 can be optically coupled to the waveguides 703 and 708. Each photonic node may be configured to extract one or more of the channels transmitted in a coupled waveguide and introduce into a coupled waveguide one or more encoded channels. One or more multi-channel lasers can be coupled to the waveguides in order to introduce unencoded carrier waves that can be used by the photonic nodes to encode information. For example, as shown in FIG. 7, a multi-channel laser 712 introduces carrier waves $\lambda_{cw1}$, $\lambda_{cw2}$, and $\lambda_{cw3}$ into the waveguide 701, carrier waves $\lambda_{cw4}$, $\lambda_{cw5}$, and $\lambda_{cw6}$ into the waveguide 702, carrier waves $\lambda_{cw7}$, $\lambda_{cw8}$, and $\lambda_{cw9}$ into the waveguide 703, and carrier waves $\lambda_{cw10}$, $\lambda_{cw11}$, and $\lambda_{cw12}$ into the waveguide 704. The photonic nodes can each be configured to extract and encode particular carrier waves. For example, the photonic nodes 710, 714, and 716 are configured to extract the carrier waves $\lambda_{cw7}$, $\lambda_{cw8}$, and $\lambda_{cw9}$, respectively, and encode information generated by electronically coupled electronic devices (not shown) in order to obtain corresponding encoded channels $\overline{\lambda}_7$, $\overline{\lambda}_9$, and $\overline{\lambda}_9$. The photonic nodes 710, 714, 716 then evanescently couple the encoded channels $\overline{\lambda}_7$, $\overline{\lambda}_8$, and $\overline{\lambda}_9$ into the waveguide 708, which can be output to an optical fiber coupled to the waveguide 708.

Figure 8A:
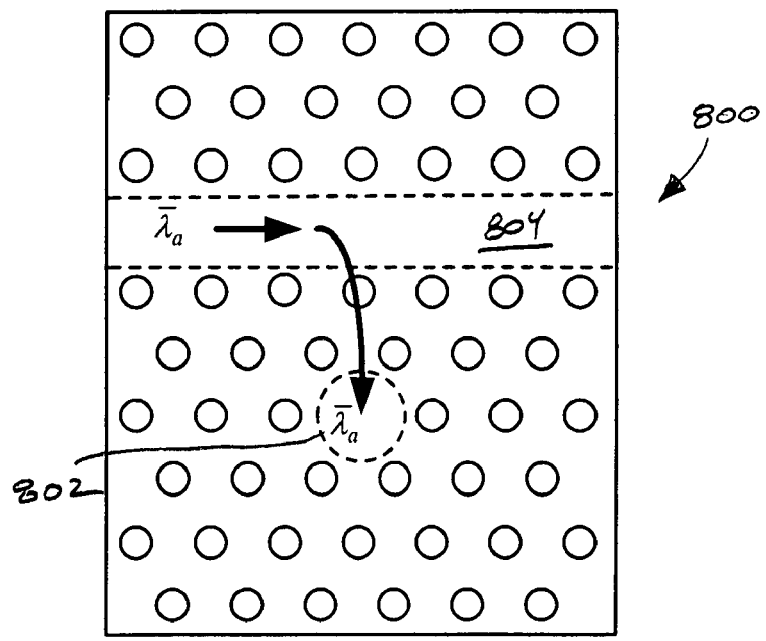
FIG. 8A illustrates a first decoder that represents an embodiment of the present invention.

Each photonic node may include a decoder that extracts a specific channel encoded with information from a waveguide and encodes the same information in electrical signals that are transmitted to electronically couple electronic devices for processing. FIG. 8A illustrates a first decoder 800 that represents an embodiment of the present invention. The decoder 800 comprises a resonant cavity 802 located in close proximity to waveguide 804. The resonant cavity 802 extracts an encoded channel $\overline{\lambda}_a$ from the waveguide 804 via evanescent coupling. The resonant cavity 802 can be configured as a photodiode that converts the information encoded channel $\overline{\lambda}_a$ into an electrical signal encoding the same information that is transmitted to and processed by a coupled electronic device.

Figure 8B:
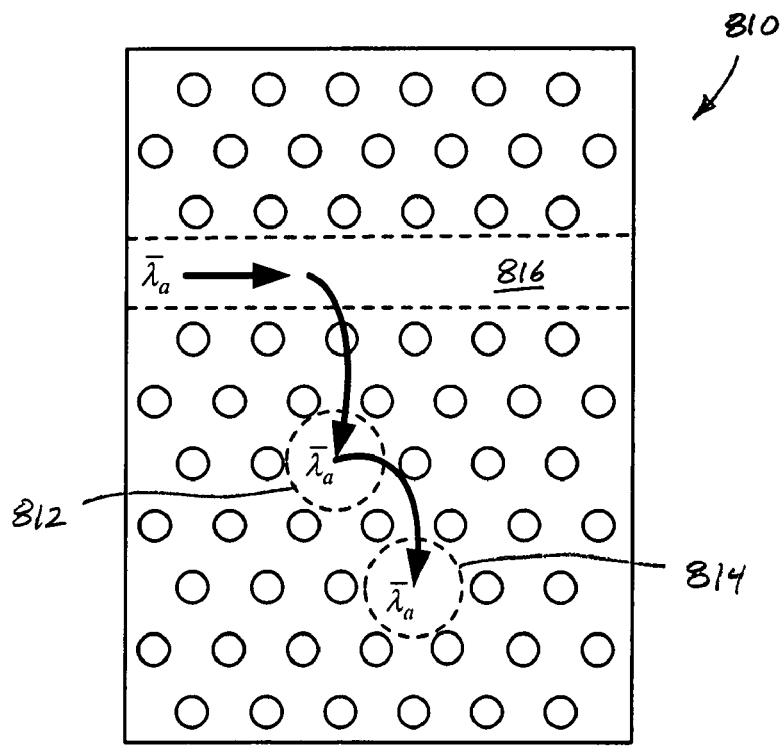
FIG. 8B illustrates a second decoder that represents an embodiment of the present invention.

FIG. 8B illustrates a second decoder 810 comprising a first resonant cavity 812 and a second resonant cavity 814. The first resonant cavity 812 is located in close proximity to a waveguide 816 and operates as a drop filter by extracting the encoded channel $\overline{\lambda}_a$ from the waveguide 816 via evanescent coupling and transmitting the encoded channel $\overline{\lambda}_a$ to the second resonant cavity 814 also via evanescent coupling. The second resonant cavity 814 can be configured as a photodiode that converts the information encoded channel $\overline{\lambda}_a$ into an electrical signal encoding the same information that is transmitted to an electronically coupled electronic device for processing.

Figure 9A:
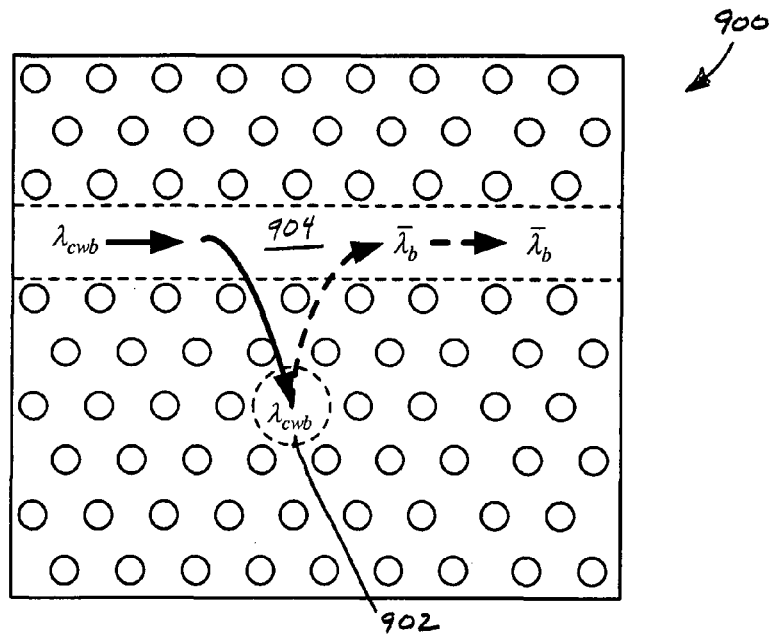
FIG. 9A illustrates a first encoder that represents an embodiment of the present invention.

Each photonic node may also include an encoder that extracts a specific carrier wave from a waveguide and encodes the information generated by an electronically coupled electronic device to produce an encoded channel that is coupled back into the waveguide. FIG. 9A illustrates a first encoder 900 that represents an embodiment of the present invention. The encoder 900 comprises a resonant cavity 902 located in close proximity to a waveguide 904. The resonant cavity 902 is configured as a drop filter to extract a particular carrier wave $\lambda_{cwb}$ from the waveguide 1702 via evanescent coupling. The resonant cavity 902 can be configured as an electro-optic modulator that modulates the carrier wave $\lambda_{cwb}$ to produce an encoded channel $\overline{\lambda}_b$, which is then introduced to the waveguide 902 via evanescent coupling.

Figure 9B:
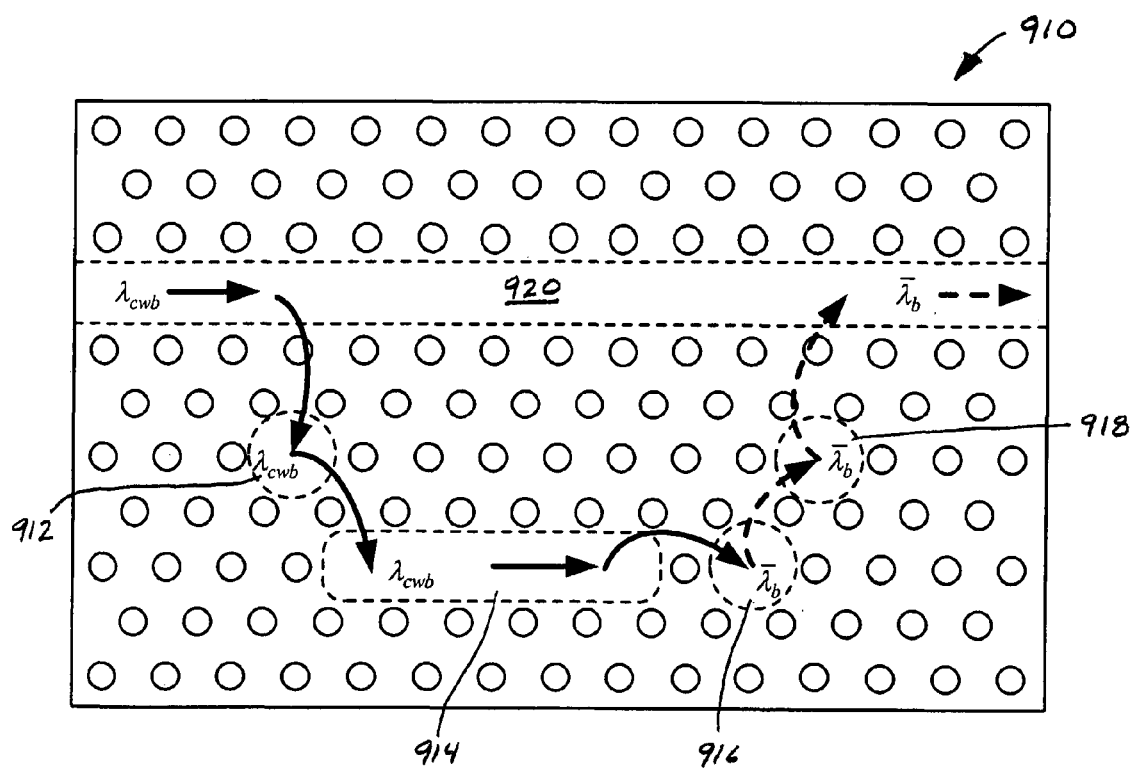
FIG. 9B illustrates a second encoder that represents an embodiment of the present invention.

FIG. 9B illustrates a second encoder 910 that represents an embodiment of the present invention. The second encoder 910 includes a first resonant cavity 912, a local waveguide 914, a second resonant cavity 916 configured as an electro-optic modulator, and a third resonant cavity 918 that operates as an add filter. The first resonant cavity 912 is configured as a drop filter in order to extract a particular carrier wave $\lambda_{cwb}$ via evanescent coupling from a waveguide 920. The carrier wave $\lambda_{cwb}$ is then transmitted via evanescent coupling from the first resonant cavity 912 into the local waveguide 914 and then coupled again via evanescent coupling into the second resonant cavity 916. The resonant cavity 916 receives electrical signals encoding information generated by an electronically coupled electronic device. The resonant cavity 916 operates as an electro-optic modulator by modulating the carrier wave $\lambda_{cwb}$ to produce an encoded channel $\overline{\lambda}_b$, which is then evanescently coupled into the third resonant cavity 918. The third resonant cavity 912 is configured to operate as an add filter by placing the encoded channel $\overline{\lambda}_b$ into the waveguide 920 via evanescent coupling.

In general, the resonant cavities configured to operate as drop filters and add filters are positioned within a range of the evanescent fields emanating from a waveguide. Both drop and add filter diameters and distances to the waveguide can be selected so that associated resonant cavities are resonators for specific channels carried by the waveguide. The dielectric constant of the photonic crystal slab, and the spacing and/or size of the lattice of cylindrical holes surrounding each resonant cavity can be selected so that the resonant cavities operated as drop filters can only extract certain channels. In order to provide strong couplings between a waveguide and a resonant cavity, the resonant cavities can be fabricated with high Q factors, such as a Q factor of about 1,000 or larger. For example, the first resonant cavity 912, shown in FIG. 9, is configured and positioned near the waveguide 920 to extract and confine the channel $\lambda_{cwb}$, and the third resonant cavity 918 configured and positioned near the bus waveguide 920 to introduce the encoded channel $\overline{\lambda}_b$ into the waveguide 920. The local waveguide 914 is located near the second resonant cavity 916 so that a large fraction of the channel $\lambda_b$ can be transmitted via evanescent coupling into the second resonant cavity 916 from the local waveguide 914. The third resonant cavity 918 is also configured and positioned to create a strong evanescent coupling with the second resonant cavity 916.

Figure 10A:
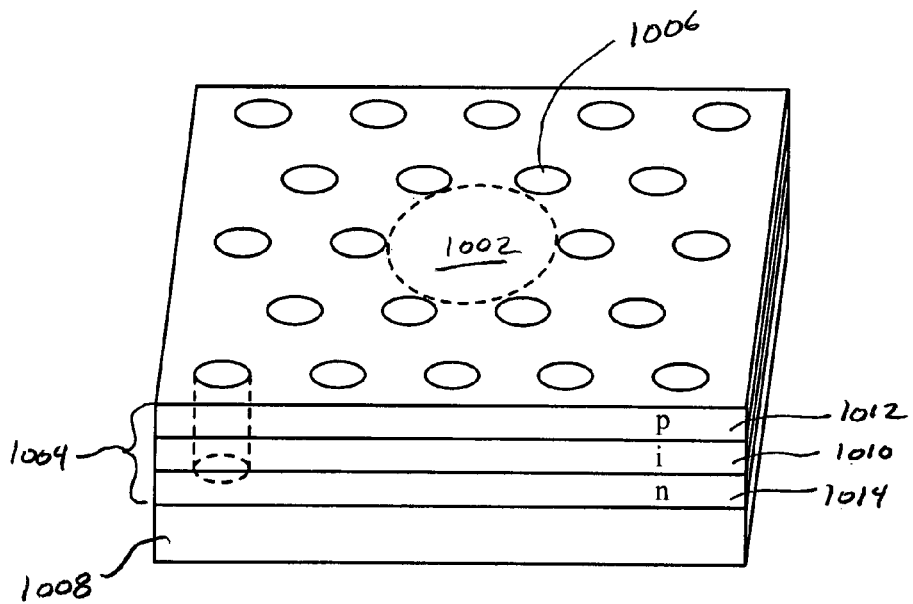
FIG. 10A illustrates a resonant cavity that represents an embodiment of the present invention.

Resonant cavities can be fabricated using a variety of different defects in a photonic crystal. FIG. 10A illustrates a resonant cavity that can be used as a drop filter, an add filter, a electro-optic modulator, and a photodiode that represents one of many embodiments of the present invention. In FIG. 10A, a resonant cavity 1002 is created by omitting a cylindrical hole within a regular triangular grid of cylindrical holes in a photonic crystal slab 1004. The diameter of the resonant cavity 1002 and the pattern and diameter of cylindrical holes surrounding the resonant cavity 1002, such as cylindrical hole 1006, can be selected to temporarily trap a particular channel within the resonant cavity 1002. A resonant cavity may also be comprises of a cylindrical hole having a diameter that is different from the diameter of the surrounding cylindrical holes, and/or filling a particular cylindrical hole with a dielectric material that is different from the dielectric material of the photonic crystal. As shown in FIG. 10A, the photonic crystal slab 1004 is supported by a substrate 1008 and the photonic crystal 1004 is composed of an intrinsic semiconductor layer 1010 sandwiched between a positively doped semiconductor layer 1012 and a negatively doped semiconductor layer 1014. The layers 1010, 1012, and 1014 comprise a single photonic-crystal layer called a "p-i-n" layer. In other embodiments of the present invention, the photonic crystal slab 1004 can be composed of a single semiconductor layer or two semiconductor layers, one positively doped and the other negatively doped.

Figure 10B:
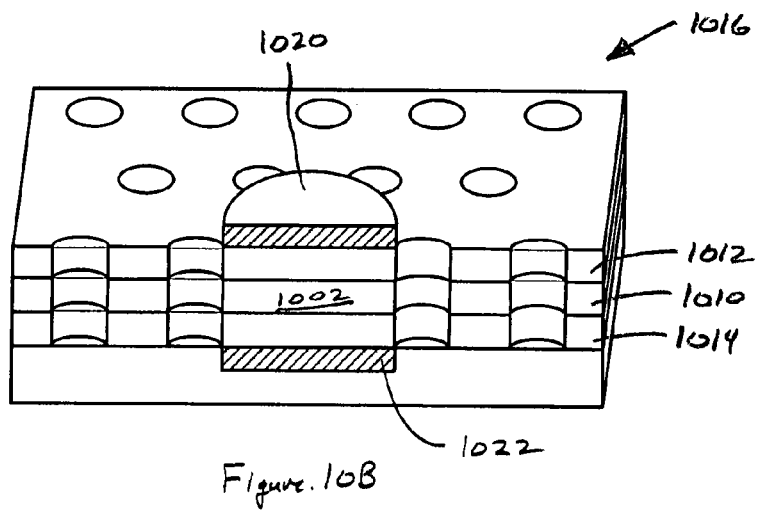
FIG. 10B illustrates a first configuration of a resonant cavity that can be operated as either an electro-optic modulator or photodiode that represents an embodiment of the present invention.

Photonic devices, such as electro-optic modulators and photodiodes, can be fabricated at resonant cavities by fabricating electrodes near the resonant cavities. FIG. 10B illustrates a first configuration of a resonant cavity that can be operated as either an electro-optic modulator or photodiode that represents one of many embodiments of the present invention. A photonic device 1016 comprises the resonant cavity 1002, sandwiched between two electrodes 1020 and 1022. The electrode 1020 is in contact with the semiconductor layer 1012, and the electrode 1022 is in contact with the semiconductor layer 1014. In order for the photonic device 1016 to operate as a photodiode, the electrodes 1020 and 1022 collect a varying electrical current generated by variations in the intensity or amplitude of the electric field component of a channel resonating in the resonant cavity 1002. The varying electrical current represents an information stream that can be transmitted from the electrodes 1020 and 1022 to an electronically coupled electronic device. The semiconductor layers 1012 and 1014 may have different dopant concentrations or dopant types so that the photonic device 1016 can be operated as an electro-optic modulator for encoding data in a carrier wave. The amplitude of the electric field component of a carrier wave resonating in the resonant cavity 1002 is changed by varying a voltage across the resonant cavity 1002, as described above with reference to FIG. 5C.

Figure 10C:
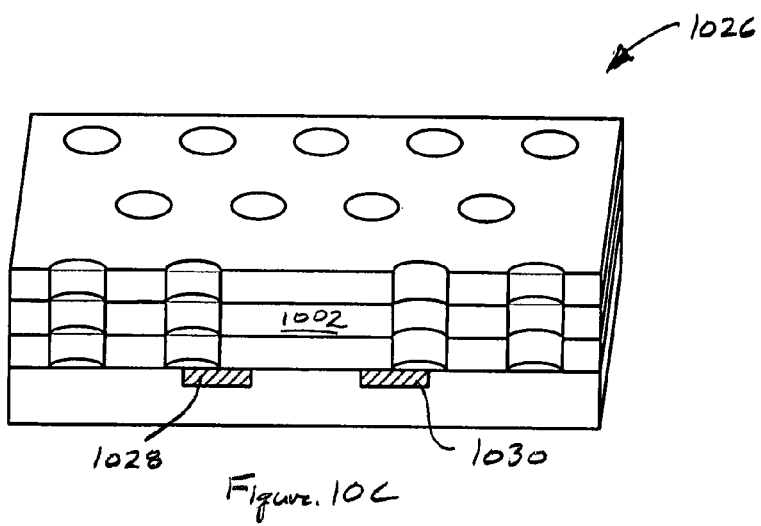
FIG. 10C illustrates a second configuration of a resonant cavity that can be operated as either an electro-optic modulator or photodiode that represents an embodiment of the present invention.

FIG. 10C illustrates a second configuration of a resonant cavity that can be operated as an electro-optic modulator that represents one of many embodiments of the present invention. As shown in FIG. 10C, a photonic device 1026 includes the resonant cavity 1002 and two electrodes 1028 and 1030 located under the resonant cavity 1002. The layer 1004 can be comprised of the p-i-n layers, described above with reference to FIG. 10A, or a single semiconductor layer. The photonic device 1026 operates as an electro-optic modulator by varying a voltage across to the electrodes 1028 and 1030 which, in turn, changes the dielectric constant of the semiconductor layers in the resonant cavity 1002 causing a phase and/or amplitude change in the electric field component of a carrier wave resonating in the resonant cavity 1002.

The intrinsic capacitance in demodulator electrode detectors is often low enough that fluctuations in current due to noise generated by thermal agitation of electrons in a conductor, called "Johnson noise," may be insignificant. As a result, statistics associated with an electromagnetic signal source dominate the bit error rate ("BER") arising in the serial digital signal corresponding to the output from the detector. For example, a Poisson distribution of an electromagnetic signal having 30 photons per bit is sufficient to achieve a BER of less than $10^{-13}$. Incorporating a doped region into a resonant cavity with a Q factor of 10 to 100 may compensate for the reduced absorption. With an appropriate choice of Q factor to impedance-match, the optical input losses of the cavity to the internal absorption loss of the detector may increase detection efficiency. For example, an increase in the detection efficiency of about 50% may be achieved.

Similar considerations can be applied to the design of a resonant cavity enhanced ("RCE") modulator using electro-optic or current injection techniques. Modulation depths as high as 50% may be achieved for a resonant cavity with a Q factor greater than about 1,000. Although other physical effects can be employed, such as variations in the free carrier plasma index, electro-optic modulation can be used with a potential difference of about 30 mV applied across a gap of about 300 nm to produce an electric field of 1 kV/cm, which is sufficient to generate a refractive index change as large as 0.001 in a wide variety of linear dielectric materials.

Figure 11:
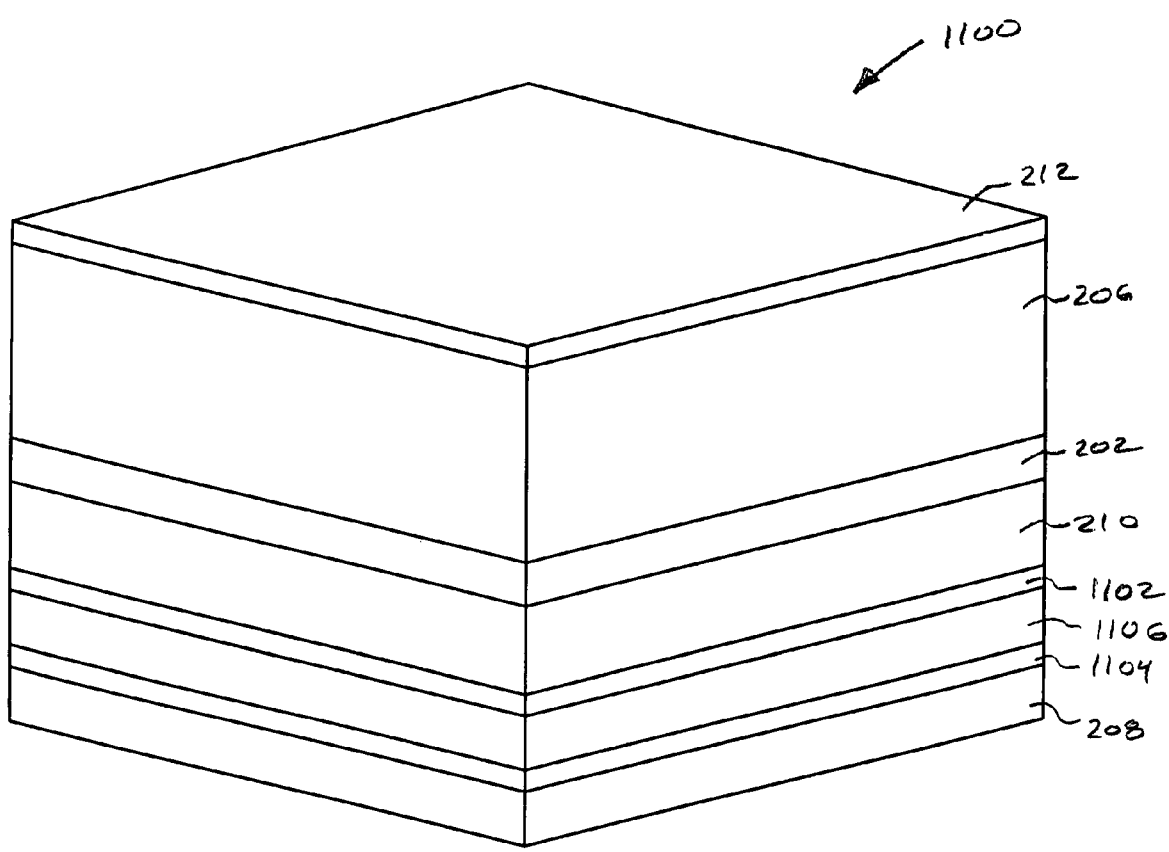
FIG. 11 illustrates an isometric view of an integrated circuit having two photonic interconnect layers that represents an embodiment of the present invention.

In other embodiments of the present invention, an integrated circuit can employ two or more photonic interconnect layers. FIG. 11 illustrates an isometric view of an integrated circuit 1100 having two photonic interconnect layers that represents an embodiment of the present invention. The integrated circuit 1100 includes a first photonic interconnect layer 1102 and a second photonic interconnect layer 1104 that receive information encoded in channels to be processed by the electronic device layer 202 and transmits information encoded in channels generated by the electronic device layer 202, as described above with reference to FIGS. 4-10. The integrated circuit also includes a cladding separating the first photonic interconnect layer 1102 from the second photonic interconnect layer 1104.

Figure 12:
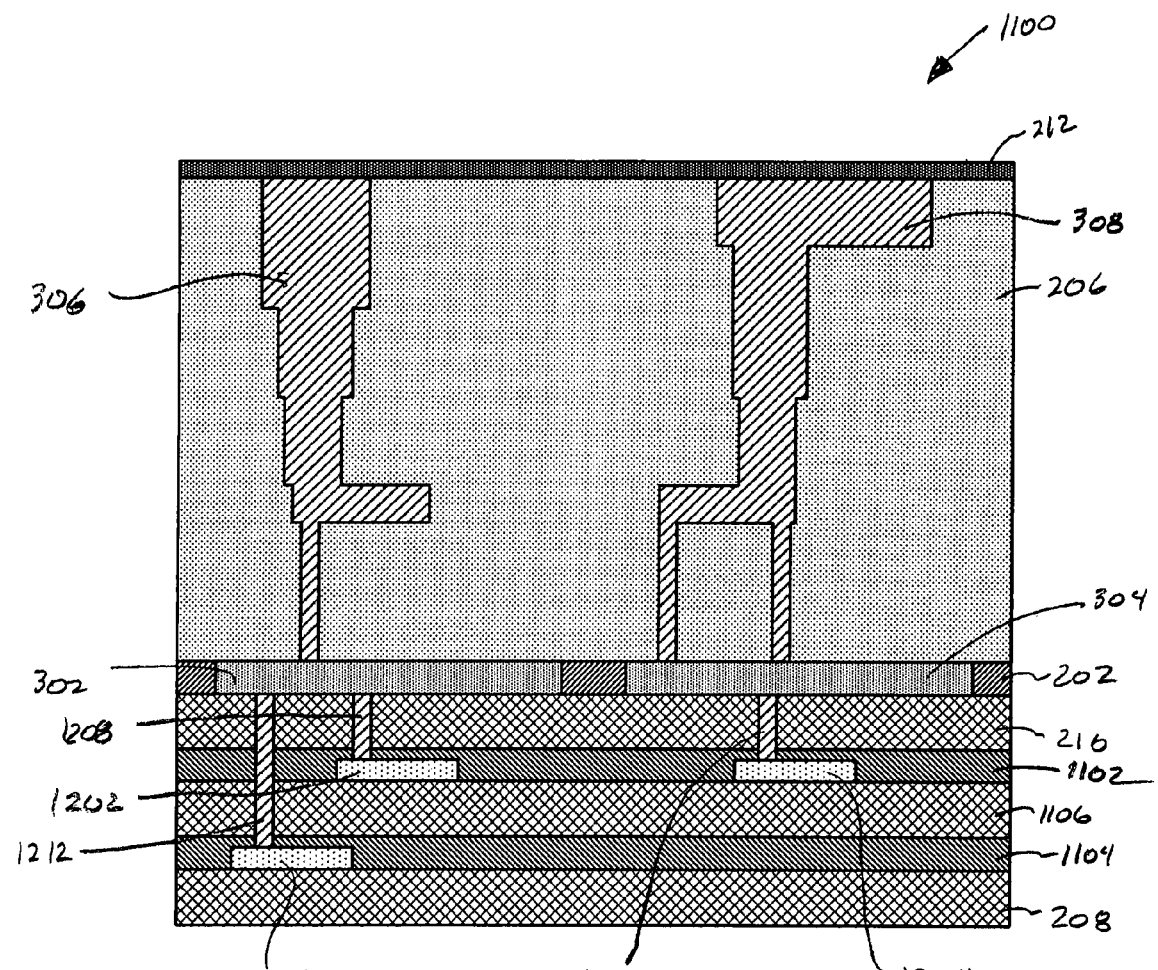
FIG. 12 illustrates a cross-sectional view of the integrated circuit, shown in FIG. 11, that represents an embodiment of the present invention.

FIG. 12 illustrates a cross-sectional view of the integrated circuit 1100, shown in FIG. 11, that represents an embodiment of the present invention. As shown in FIG. 12, the first photonic interconnect layer 1102 includes a first photonic device 1202 and a second photonic device 1204, and the second photonic interconnect layer 1104 includes a third photonic device 1206. The first photonic device 1202 is in electrical communication with the first integrated circuit 302 via a first interconnect 1208, the second photonic device 1204 is in electrical communication with the second integrated circuit 304 via a second interconnect 1210, and the third photonic device 1206 is in electrical communication with first integrated circuit 302 via a third interconnect 1212. In certain embodiments of the present invention, the interconnects 1208, 1210, and 1212 can be composed of Cu, Al, Pt, or other suitable conductor materials. In other embodiments of the present invention, the interconnects 1208, 1210, and 1212 can be waveguides that transmit modes of electromagnetic radiation from the photonic devices 1202, 1204, and 1206 to modulators and photodiodes located within the electronic device layer 202.

In various embodiments of the present invention, the type of semiconductor materials and compounds used to form the photonic devices in the photonic interconnect layers is determined by the wavelengths selected for the carrier waves and encoded channels. For example, Si-based waveguides, Si-based electro-optic modulators, Ge-based electro-optic modulators, SiGe-based photodiodes, and Ge-based photodiodes are used with channels and laser sources providing carriers waves with wavelengths between about 1400 nm and about 1600 nm. In addition, for SiN-based waveguides, SiC-based waveguides, SiN/SiC-based electro-optic modulators, polymer-based electro-optic modulators, and Si-based photodiodes are used with channels and laser sources providing carrier waves with wavelengths between about 700 nm and about 900 nm.

Figure 13:
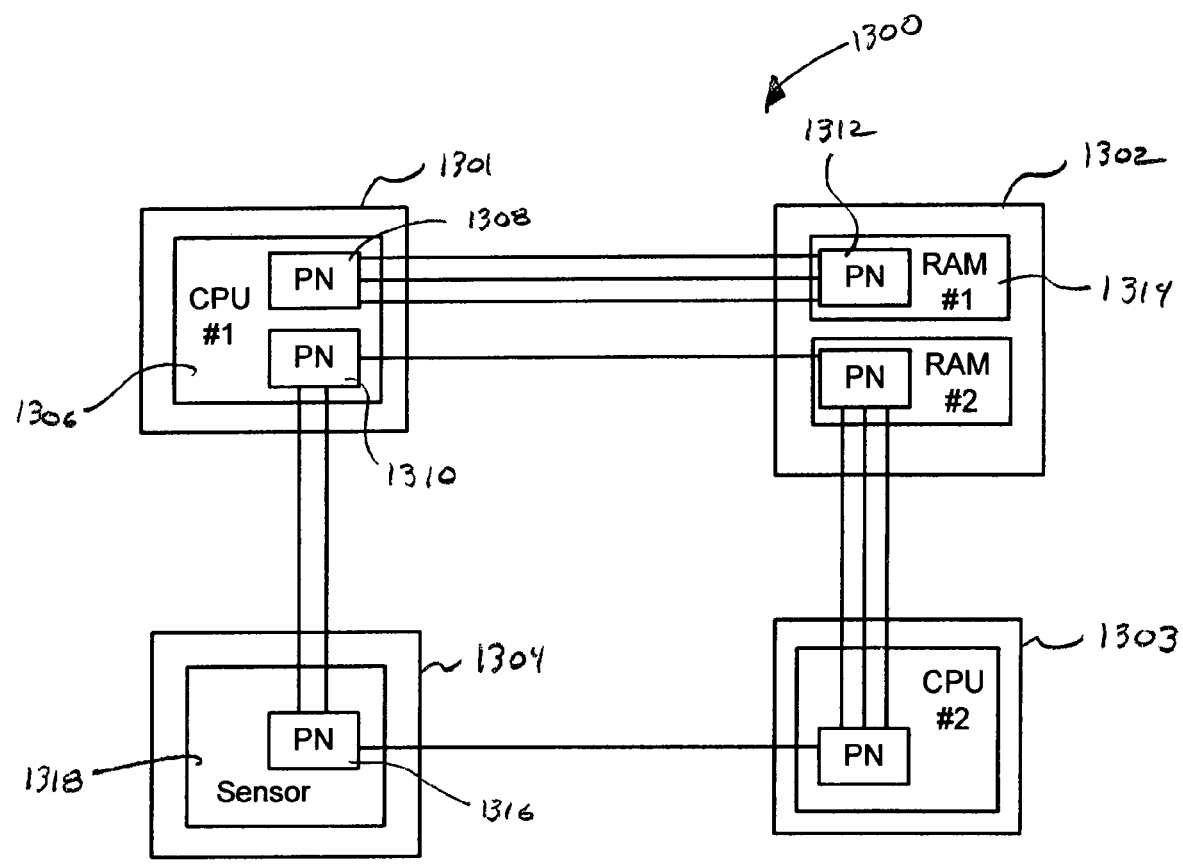
FIG. 13 illustrates a network comprising four chips interconnected via photonic-based interconnects that represents an embodiment of the present invention.

FIG. 13 illustrates a network 1300 comprising four chips 1301-1304 interconnected via photonic-based interconnects that represents an embodiment of the present invention. Electronic devices of the chips 1301-1304 are interconnected by waveguides, such as photonic crystal waveguides or optical fibers. For example, CPU 1306 is coupled to photonic nodes 1308 and 1310. The photonic node 1308 is interconnected to the photonic node 1312, which is coupled to RAM 1314, and the photonic node 1310 is interconnected to the photonic node 1316, which is coupled to sensor 1318. Note that the number of waveguides needed to interconnect the photonic nodes is based on the bandwidth requirements for transmitting electromagnetic signals between the corresponding coupled subsystems. For example, three waveguides are used to interconnect the photonic nodes 1308 and 1312, and two waveguides are used to interconnect the photonic node 1310 to the photonic node 1316.

The following describes a number of method embodiments directed to fabricating the photonic integrated circuit 200. Note that in certain method embodiments, the order of the steps described below may be changed according to the temperature at which certain features are formed. For example, a first set of method steps can be used to form a first set of electronic and photonic features within a high temperature range and a second set of method steps can be used to form electronic and photonic features within a relatively lower temperature range.

Figure 14A:
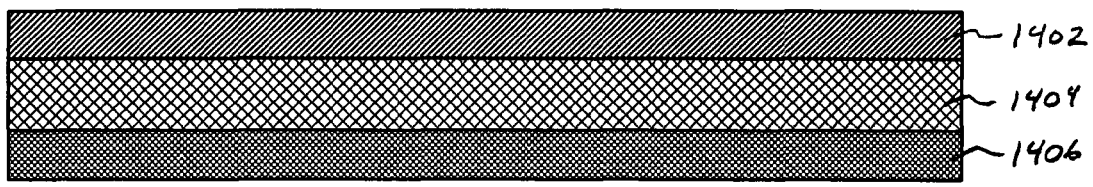
FIGS. 14A-14G illustrate processing steps for forming an integrated circuit using cross-sectional views that represent embodiments of the present invention.

A first method for fabricating the integrated circuit 200 is described below with reference to FIGS. 14A-14G. FIGS. 14A-14G illustrate processing steps for forming the integrated circuit 200 using cross-sectional views that represent embodiments of the present invention. First, as shown in FIG. 14A, a three-layer substrate 1400 is provided. The substrate 1400 comprises a first layer of silicon 1402 attached to a surface of a first oxide layer 1404. The silicon layer 1402 and the oxide layer 1404 are often referred to as "silicon-on-insulator" ("SOI"). The substrate 1400 also includes a second semiconductor layer 1406 attached to an opposing surface of the oxide layer 1404. The oxide layer 1404 can be composed of SiO$_2$ or another suitable insulating material; and the semiconductor layer 1406 can be composed of either silicon or a silicon/germanium compound.

Figure 14B:
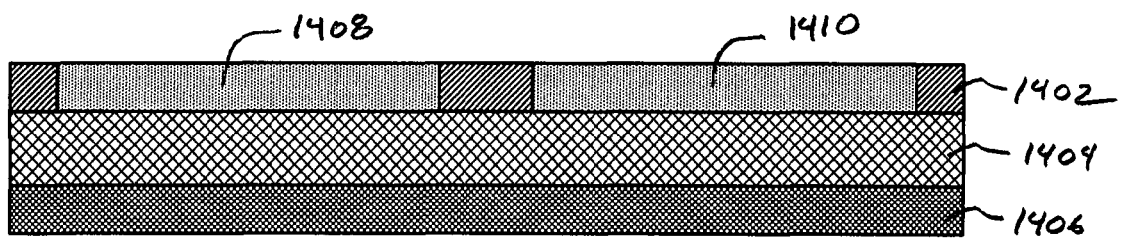

Next, as shown in FIG. 14B, electronic devices 1408 and 1410 are formed in the first silicon layer 1402. Photolithography and etching methods for forming components of the electronic devices 1408 and 1410, such as transistors and capacitors, are well-known in the art. The first silicon layer 1402 with electronic devices 1408 and 1410 corresponds to the electronic device layer 202 described above.

Figure 14C:
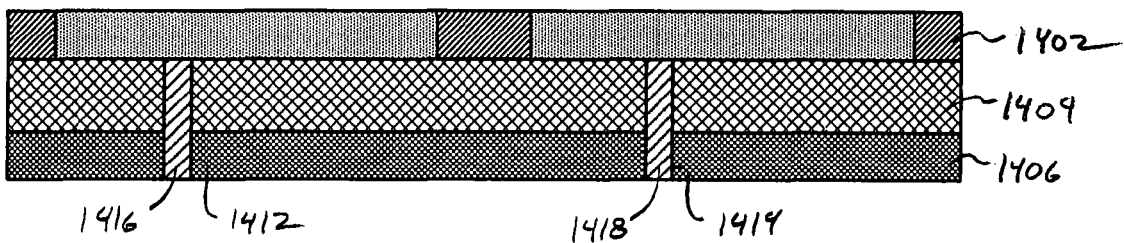

Next, as shown in FIG. 14C, vias 1412 and 1414 are formed in the oxide layer 1404 and the semiconductor layer 1406. The vias 1412 and 1414 extend through both the oxide layer 1404 and the semiconductor layer 1406 and can be formed using one or more well-known etching techniques, such as reactive-ion etching, focused ion-beam etching, and chemically assisted ion-beam etching. Interconnects 1416 and 1418 are then formed within the vias 1412 and 1414, respectively. The interconnects 1416 and 1418 are composed of conductive material, such as Cu, Al, Pt, or other suitable conductive materials and can be deposited in the vias 1412 and 1414 using chemical-vapor deposition, plasma-enhanced chemical vapor deposition, or a physical vapor deposition technique, such as sputtering.

Figure 14D:
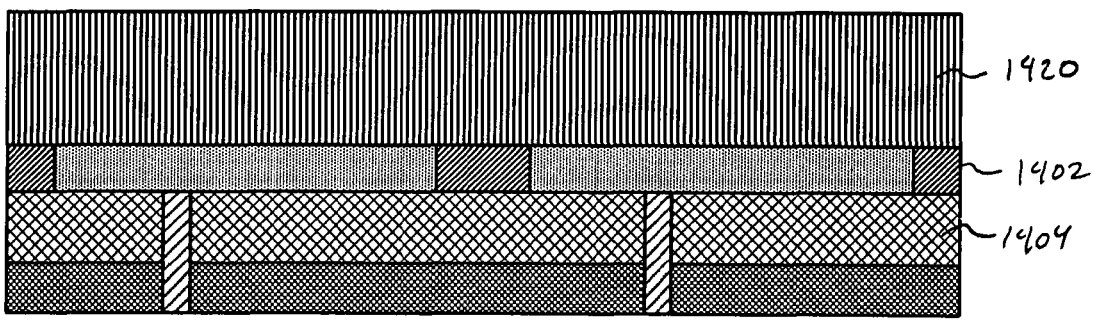

Next, as shown in FIG. 14D, a first carrier wafer 1420 may be attached to the first silicon layer 1402. The first carrier wafer 1420 can be a layer of silicon or other suitable material which is attached to the silicon layer 1402 using an adhesive, such as epoxy, glue, or another suitable bonding substance for bonding the carrier wafer 1420 to the first silicon layer 1402.

Figure 14E:
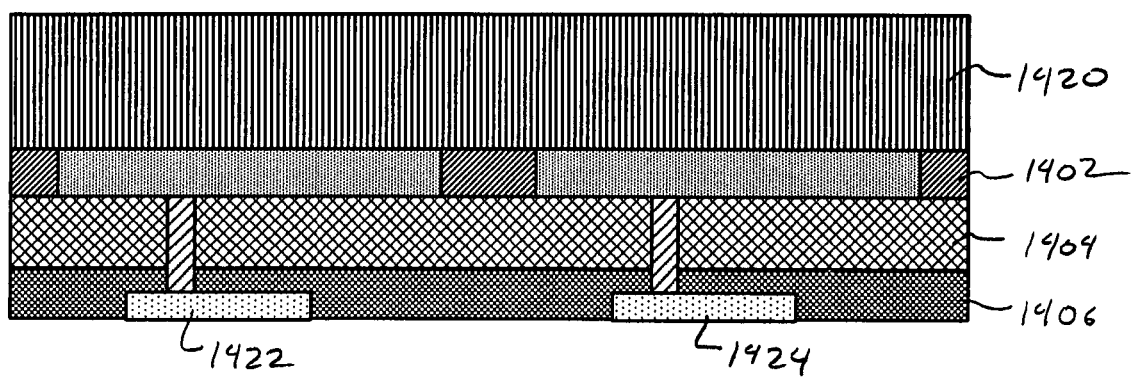

The carrier wafer 1420 can be used to support the three-layer substrate 1400 during the next step shown in FIG. 14E. As shown in FIG. 14E, photonic devices 1420 and 1422 are formed in the semiconductor layer 1406. The photonic devices 1420 and 1422 can be electro-optic modulators, photodiodes, waveguides, and photonic nodes, and can be formed using various lithographic and etching techniques. For example, the photonic devices 1420 and 1422 can be formed using reactive-ion etching, focused ion-beam etching, chemically assisted ion-beam etching, electron beam lithography, photolithography, and nanoimprint lithography. The semiconductor layer 1406 with photonic devices 1422 and 1424 corresponds to the photonic interconnect layer 204 described above.

Figure 14F:
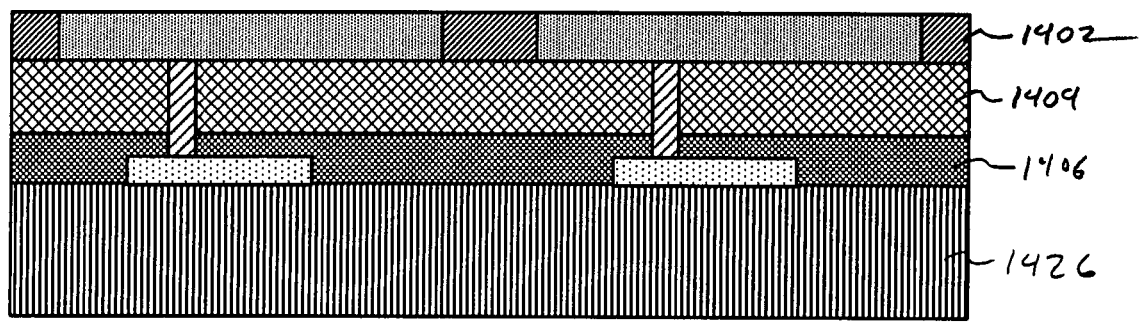
Figure 14G:
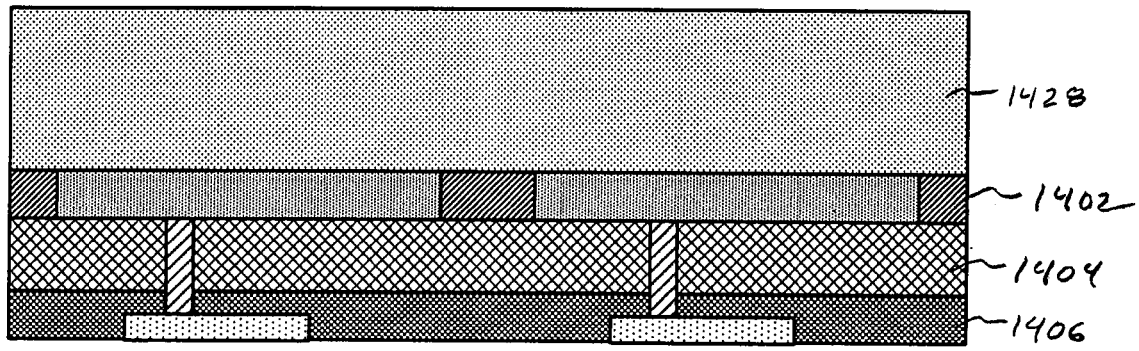

Next, as shown in FIG. 14F, the first carrier wafer 1420 is detached from the first silicon layer 1402 and a second carrier wafer 1426 is attached to the semiconductor layer 1406 using an adhesive. As shown in FIG. 14G, the second carrier wafer 1426 provides a support for forming an electronic interconnect layer 1428, which corresponds to the electronic interconnect layer 206 described above and can be formed using any number of well-known techniques. In another embodiment of the present invention, the step described with reference to FIG. 14G can be performed after the step described with reference to FIG. 14B, which eliminates the need for the first carrier wafer 1420.

Figure 15A:
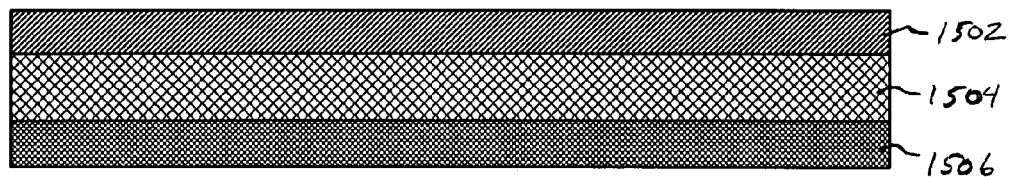
FIGS. 15A-15F illustrate processing steps for forming an integrated circuit using cross-sectional views that represent embodiments of the present invention.

A second method for fabricating the integrated circuit 200 is described below with reference to FIGS. 15A-15F. FIGS. 15A-15F illustrate processing steps for forming the integrated circuit 200 using cross-sectional views that represent embodiments of the present invention. First, as shown in FIG. 15A, a three-layer substrate 1500 is provided. Like the substrate 1400, the substrate 1500 comprises a first layer of silicon 1502 attached to a surface of a first oxide layer 1504, which is referred to as "silicon-on-insulator" ("SOI"). The substrate 1500 also includes a second semiconductor layer 1506 attached to an opposing surface of the oxide layer 1504. The first oxide layer 1504 can be composed of SiO$_2$ or another suitable insulating material, and the semiconductor layer 1506 can be composed of either silicon or a silicon/germanium compound.

Figure 15B:
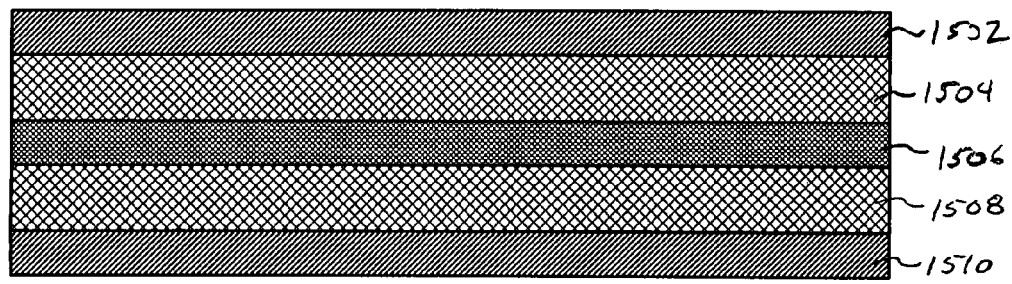

Next, as shown in FIG. 15B, a second oxide layer 1508 is deposited on a surface of the semiconductor layer 1506, and a second silicon layer 1510 is deposited on a surface of the second oxide layer 1508. The second silicon layer 1510 can be deposited using chemical vapor deposition, plasma-enhanced chemical vapor deposition, low pressure chemical vapor deposition, or sputter deposition. The second silicon layer 1510 can be formed in a separate processing step and attached to the second oxide layer 1508 using smart cut or wafer bonding.

Figure 15C:
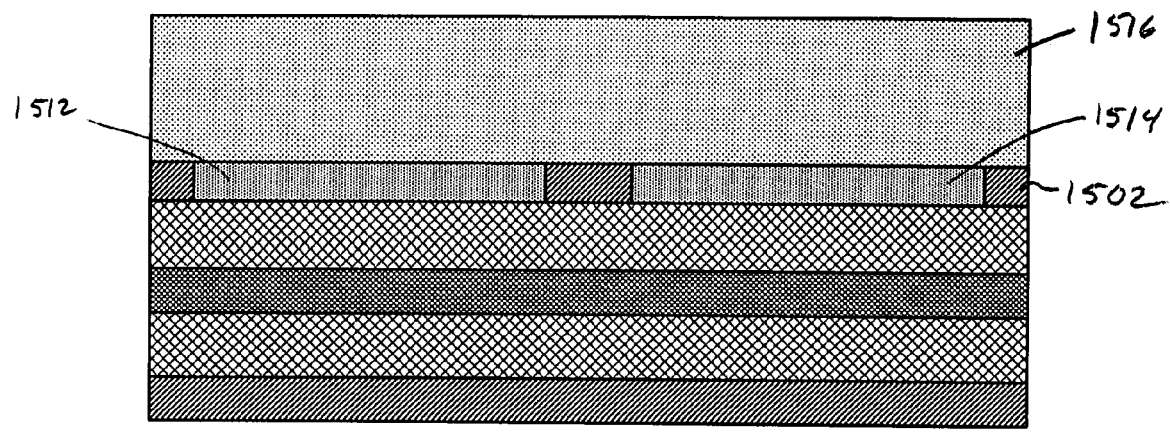

Next, as shown in FIG. 15C, electronic devices 1512 and 1514 are formed in the first silicon layer 1502 using well-know photolithography and etching. The first silicon layer 1502 with electronic devices 1512 and 1514 corresponds to the electronic device layer 202 described above. Next, an electronic interconnect layer 1516 is formed on the first silicon layer 1502 using well-known techniques. The electronic interconnect layer 1516 corresponds to the electronic interconnect layer 206 described above.

Figure 15D:
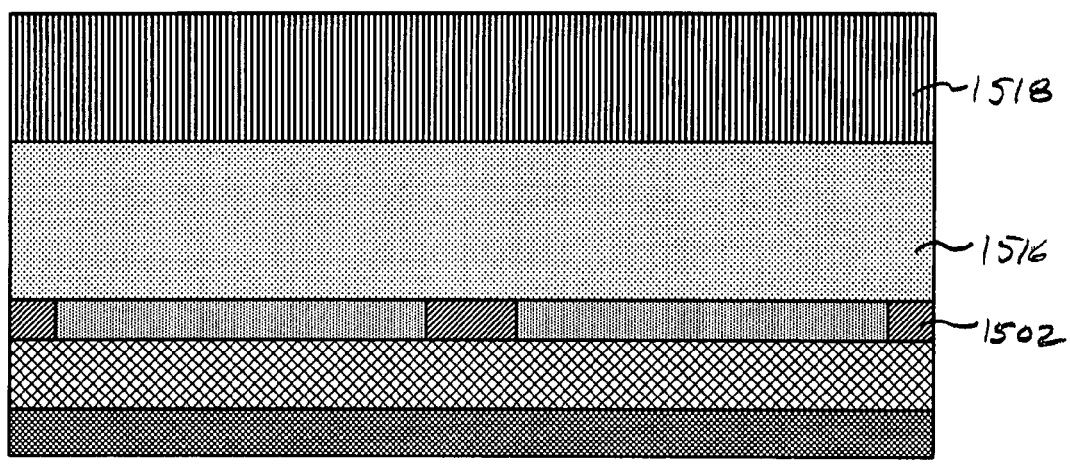
Figure 15E:
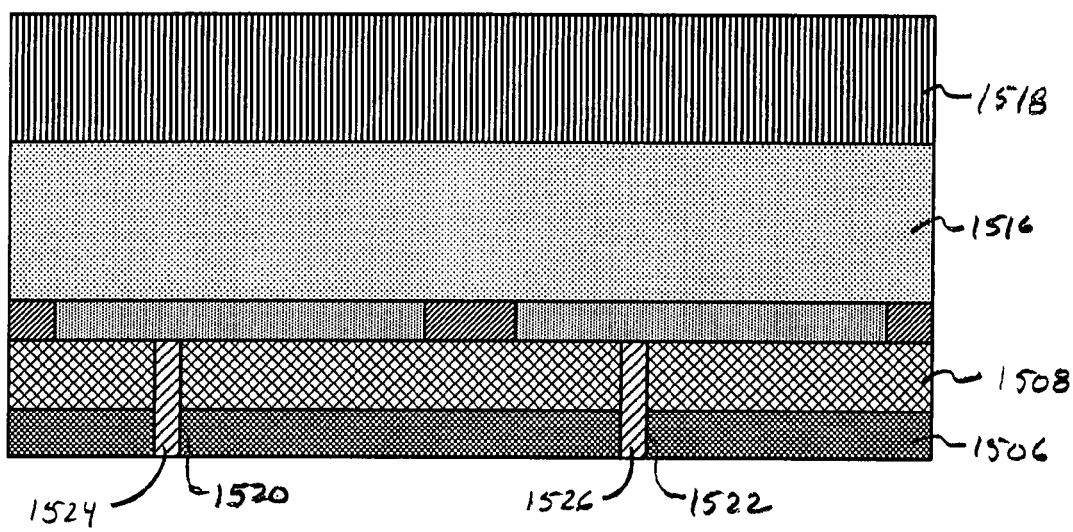
Figure 15F:
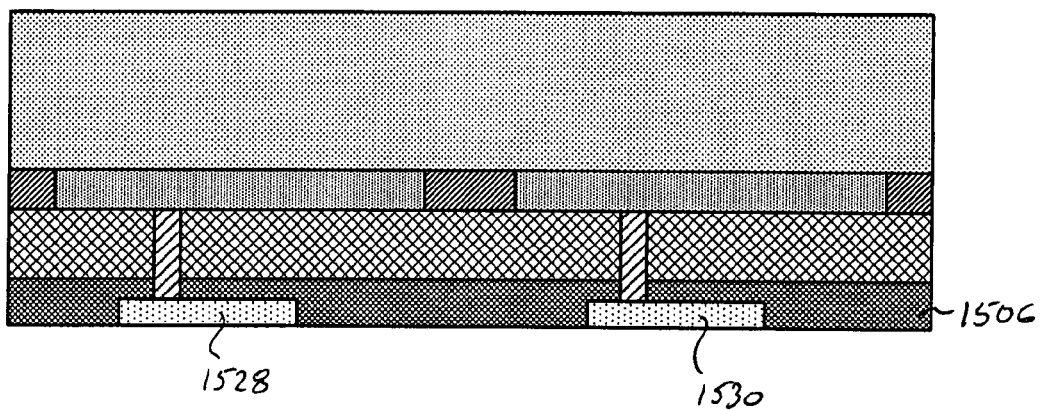

Next, as shown in FIG. 15D, a carrier wafer 1518 is bonded to the electronic interconnect layer 1516 using an adhesive, such as an epoxy, glue, or another suitable bonding substance. In addition, the second silicon layer 1510 and the oxide layer 1508 are removed using reactive-ion etching, focused ion-beam etching, and chemically assisted ion-beam etching.

The carrier wafer 1518 provides support for forming vias 1520 and 1522 are formed in the oxide layer 1508 and the semiconductor layer 1506. The vias 1520 and 1522 extend through both the oxide layer 1508 and the semiconductor layer 1506. Interconnects 1524 and 1526 are then formed within the vias 1520 and 1522, respectively. The vias 1520 and 1522 and the interconnects 1524 and 1526 can be formed as described above with reference to FIG. 14C.

Next, as shown in FIG. 14F, photonic devices 1528 and 1530 are formed in the semiconductor layer 1506. The photonic devices 1528 and 1530 can be electro-optic modulators, photodiodes, waveguides, and photonic nodes, and can be formed using various lithographic and etching techniques, as described above with reference to FIG. 14E.

Figure 16A:
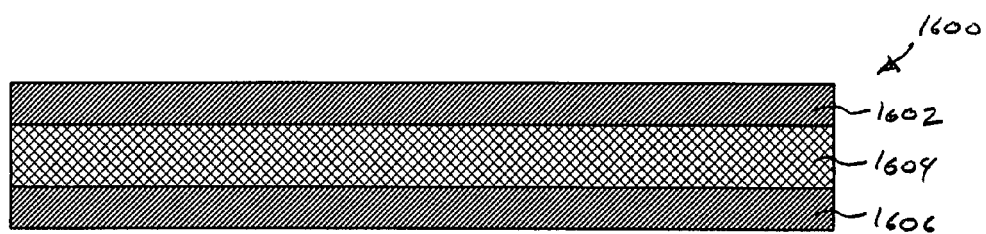
FIGS. 16A-16D illustrate processing steps for forming an integrated circuit using cross-sectional views that represents an embodiment of the present invention.

A third method for fabricating the integrated circuit 200 is described below with reference to FIGS. 16A-16D. FIGS. 16A-16D illustrate processing steps for forming the integrated circuit 200 using cross-sectional views that represents an embodiment of the present invention. First, as shown in FIG. 16A, a three-layer substrate 1600 is provided. The substrate 1600 includes a silicon-on-insulator substrate comprising a first layer of silicon 1602 attached to a surface of a first oxide layer 1604. The substrate 1600 also includes a second silicon layer 1606 attached to an opposing surface of the oxide layer 1604. The first oxide layer 1604 can be composed of $SiO_2$ or another suitable insulating material.

Figure 16B:
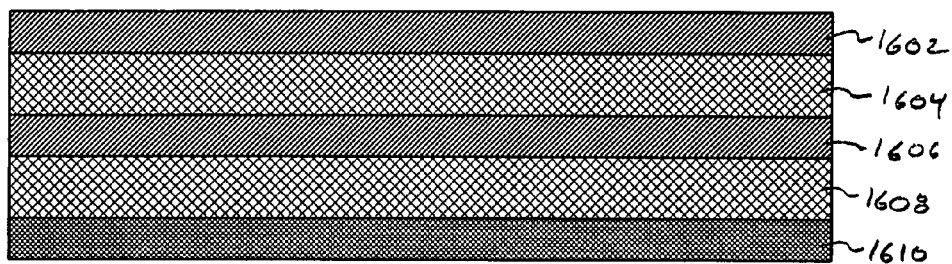

Next, as shown in FIG. 16B, a second oxide layer 1608 is deposited on a surface of the second silicon layer 1606, and a semiconductor layer 1610 is deposited on a surface of the second oxide layer 1608. The second oxide layer 1608 is composed of $SiO_2$ and can be deposited using chemical vapor deposition, plasma-enhanced chemical vapor deposition, low pressure chemical vapor deposition, spattering, and thermal oxidation. The semiconductor layer 1610 is composed of silicon or silicon/germanium and can be formed in a separate processing step and attached to the second oxide layer 1608 using wafer bonding.

Figure 16C:
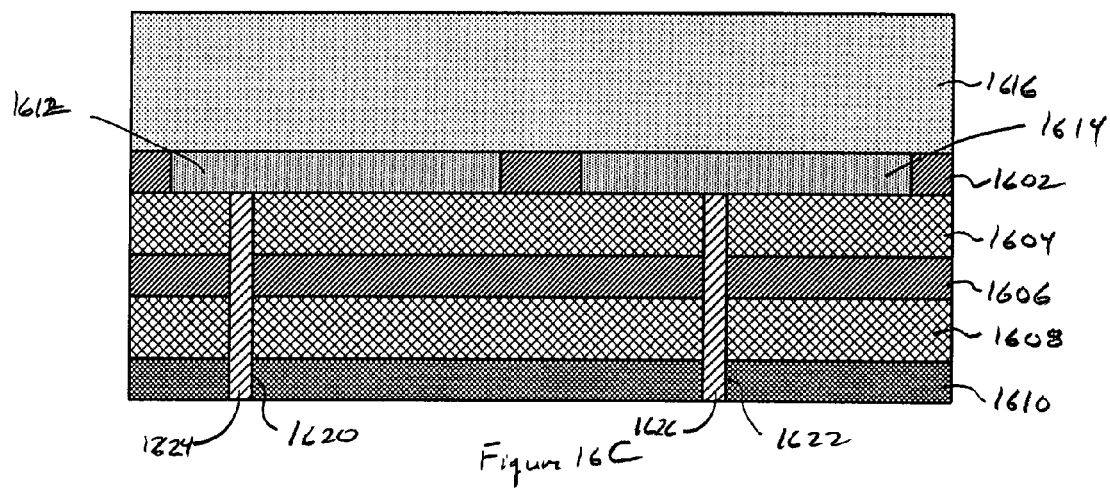

Next, as shown in FIG. 16C, electronic devices 1612 and 1614 are formed in the first silicon layer 1602 using well-know photolithography and etching techniques. The first silicon layer 1602 with electronic devices 1612 and 1614 corresponds to the electronic device layer 202 described above. Next, an electronic interconnect layer 1616 can be formed on the first silicon layer 1602 using well-known techniques. The electronic interconnect layer 1616 corresponds to the electronic interconnect layer 206 described above. Next, vias 1620 and 1622 are formed in the first and second oxide layers 1604 and 1608, the second silicon layer 1606, and the semiconductor layer 1610. The vias 1620 and 1622 extend through both the oxide layer 1508 and the semiconductor layer 1506. Interconnects 1624 and 1626 are then formed within the vias 1520 and 1522, respectively. The vias 1620 and 1622 and the interconnects 1624 and 1626 can be formed as described above with reference to FIG. 14C.

Figure 16D:
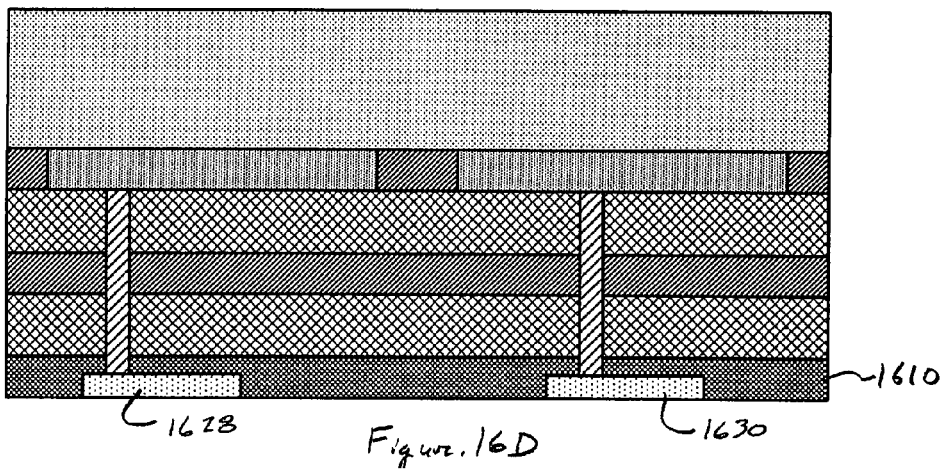

Next, as shown in FIG. 16D, photonic devices 1628 and 1630 are formed in the semiconductor layer 1610. The photonic devices 1628 and 1630 can be electro-optic modulators, photodiodes, waveguides, and photonic nodes, and can be formed using various lithographic and etching techniques, as described above with reference to FIG. 14E.

The foregoing description, for purposes of explanation, used specific nomenclature to provide a thorough understanding of the invention. However, it will be apparent to one skilled in the art that the specific details are not required in order to practice the invention. The foregoing descriptions of specific embodiments of the present invention are presented for purpose of illustration and description. They are not intended to be exhaustive or to limit the invention to the precise forms disclosed. Many modifications and variations are possible in view of the above teachings. The embodiments are shown and described in order to best explain the principles of the invention and its practical applications, to thereby enable others skilled in the art to best utilize the invention and various embodiments with various modifications as are suited to the particular use contemplated. It is intended that the scope of the invention be defined by the following claims and their equivalents:

The invention claimed is:

1. An integrated circuit comprising:
    an electronic device layer attached to a surface of an intermediate layer, the electronic device layer having one or more electronic devices, and the intermediate layer includes a solid slab of material having one or more interconnects extending through the intermediate layer; and
    a photonic interconnect layer having one or more photonic devices, wherein the one or more photonic devices are configured to receive data encoded electromagnetic radiation input to the integrated circuit for processing and send data generated by the electronic device layer encoded in electromagnetic radiation, and wherein the intermediate layer is disposed and substantially fills the space between the electronic device layer and the photonic interconnect layer, such that at least one photonic device of the photonic interconnect layer is in communication with at least one of the electronic devices of the electronic device layer through at least one interconnect extending through the intermediate layer, the at least one interconnect configured to transmit electromagnetic radiation between the at least one photonic device and the at least one electronic device.

2. The integrated circuit of claim 1 further comprising:
    an electronic interconnect layer attached to the electronic device layer and providing electrical communication between the one or more electronic devices of the electronic device layer and providing electrical communication between the one or more electronic devices of the electronic device layer and other electronic devices.

3. The integrated circuit of claim 1 wherein the one or more electronic devices further comprises transistors and capacitors.

4. The integrated circuit of claim 1 wherein the one or more electronic devices can be configured to form one or more of:
   random access memory;
   read only memory;
   a central processing unit;
   a field programmable gate array; and
   an application specific integrated circuit.

5. The integrated circuit of claim 1 wherein the photonic devices further comprises one or more of
   a photodiode;
   a waveguide;
   an electro-optic modulator; and
   a photonic node.

6. The integrated circuit of claim 1 wherein when using a laser source to provide electromagnetic signals with wavelengths between about 1400 nm and about 1600 nm, the photonic interconnect layer further comprises one or more of:
   SiN-based waveguides;
   SiC-based waveguides;
   polymer waveguides;
   Si-based electro-optic modulators;
   Ge-based electro-optic modulators;
   SiGe-based photodiodes; and
   Ge-based photodiodes.

7. The integrated circuit of claim 1 wherein when using a laser source to provide electromagnetic signals with wavelengths between about 700 nm and about 900 nm, the photonic interconnect layer further comprises one or more of:
   SiN-based waveguides;
   SiC-based waveguides;
   SiN/SiC-based electro-optic modulators; and
   polymer-based electro-optic modulators.

8. The integrated circuit of claim 1 wherein the slab material of the intermediate layer further comprises one of:
   a single layer of $SiO_2$; and
   a layer of Si sandwiched between two layers of $SiO_2$.

9. The integrated circuit of claim 1 wherein the one or more interconnects extending through the intermediate layer further comprise conductive elements or waveguides embedded in a dielectric material for transmitting electrical or optical signals, respectively, between the one or more electronic devices of the electronic device layer and the one or more photonic devices of the photonic interconnect layer.

* * * * *

UNITED STATES PATENT AND TRADEMARK OFFICE
CERTIFICATE OF CORRECTION

| | | |
|---|---|---|
| PATENT NO. | : 7,778,501 B2 | Page 1 of 1 |
| APPLICATION NO. | : 11/732549 | |
| DATED | : August 17, 2010 | |
| INVENTOR(S) | : Raymond G. Beausoleil et al. | |

It is certified that error appears in the above-identified patent and that said Letters Patent is hereby corrected as shown below:

In column 15, line 14, in Claim 5, delete "of" and insert -- of: --, therefor.

Signed and Sealed this
Fifth Day of April, 2011

David J. Kappos
*Director of the United States Patent and Trademark Office*